(12) United States Patent
Chida et al.

(10) Patent No.: US 12,464,889 B2
(45) Date of Patent: Nov. 4, 2025

(54) LIGHT-EMITTING DEVICE AND METHOD FOR MANUFACTURING LIGHT-EMITTING DEVICE

(71) Applicant: Semiconductor Energy Laboratory Co., Ltd., Kanagawa-ken (JP)

(72) Inventors: Akihiro Chida, Kanagawa (JP); Tomoya Aoyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 264 days.

(21) Appl. No.: 17/830,533

(22) Filed: Jun. 2, 2022

(65) Prior Publication Data
US 2022/0302411 A1    Sep. 22, 2022

Related U.S. Application Data

(60) Continuation of application No. 16/900,034, filed on Jun. 12, 2020, now Pat. No. 11,355,729, which is a
(Continued)

(30) Foreign Application Priority Data

Sep. 6, 2013 (JP) .................................. 2013-184698
Oct. 21, 2013 (JP) .................................. 2013-218601

(51) Int. Cl.
*H10K 50/842* (2023.01)
*H10K 77/10* (2023.01)

(52) U.S. Cl.
CPC ........ *H10K 50/8426* (2023.02); *H10K 77/111* (2023.02)

(58) Field of Classification Search
CPC .......................... H10K 50/8426; H10K 77/111
See application file for complete search history.

(56) References Cited

U.S. PATENT DOCUMENTS

| | | | |
|---|---|---|---|
| 5,821,138 | A | 10/1998 | Yamazaki et al. |
| 5,854,123 | A | 12/1998 | Sato et al. |

(Continued)

FOREIGN PATENT DOCUMENTS

| | | | |
|---|---|---|---|
| CN | 001228607 | A | 9/1999 |
| CN | 001571598 | A | 1/2005 |

(Continued)

OTHER PUBLICATIONS

Dictionary Definition of Periphery. No Date.*
(Continued)

*Primary Examiner* — Nathan W Ha
(74) *Attorney, Agent, or Firm* — Husch Blackwell LLP

(57) ABSTRACT

A highly reliable flexible light-emitting device is provided. The light-emitting device includes a first flexible substrate, a second flexible substrate, a light-emitting element between the first flexible substrate and the second flexible substrate, a first bonding layer; and a second bonding layer in a frame shape surrounding the first bonding layer. The first bonding layer and the second bonding layer are between the second flexible substrate and the light-emitting element. The light-emitting element includes layer containing a light-emitting organic compound between the pair of electrodes. The second bonding layer has a higher gas barrier property than the first bonding layer.

2 Claims, 24 Drawing Sheets

Related U.S. Application Data continuation of application No. 15/707,383, filed on Sep. 18, 2017, now Pat. No. 10,686,157, which is a division of application No. 14/476,154, filed on Sep. 3, 2014, now Pat. No. 9,773,998.

(56) References Cited

U.S. PATENT DOCUMENTS

| | | |
|---|---|---|
| 5,891,298 A | 4/1999 | Kuroda et al. |
| 6,072,239 A | 6/2000 | Yoneda et al. |
| 6,100,166 A | 8/2000 | Sakaguchi et al. |
| 6,127,199 A | 10/2000 | Inoue et al. |
| 6,326,279 B1 | 12/2001 | Kakizaki et al. |
| 6,342,433 B1 | 1/2002 | Ohmi et al. |
| 6,372,608 B1 | 4/2002 | Shimoda et al. |
| 6,391,220 B1 | 5/2002 | Zhang et al. |
| 6,452,091 B1 | 9/2002 | Nakagawa et al. |
| 6,544,430 B2 | 4/2003 | Mccormack et al. |
| 6,592,739 B1 | 7/2003 | Sonoda et al. |
| 6,597,039 B2 | 7/2003 | Ohmi et al. |
| 6,682,963 B2 | 1/2004 | Ishikawa |
| 6,846,696 B2 | 1/2005 | Adachi et al. |
| 6,849,877 B2 | 2/2005 | Yamazaki et al. |
| 6,879,110 B2 | 4/2005 | Koyama |
| 6,946,361 B2 | 9/2005 | Takayama et al. |
| 6,953,735 B2 | 10/2005 | Yamazaki et al. |
| 6,982,181 B2 | 1/2006 | Hideo |
| 7,015,075 B2 | 3/2006 | Fay et al. |
| 7,029,950 B2 | 4/2006 | Yonehara et al. |
| 7,056,810 B2 | 6/2006 | Yamazaki et al. |
| 7,060,153 B2 | 6/2006 | Yamazaki et al. |
| 7,067,392 B2 | 6/2006 | Yamazaki et al. |
| 7,122,445 B2 | 10/2006 | Takayama et al. |
| 7,122,447 B2 | 10/2006 | Abe |
| 7,147,740 B2 | 12/2006 | Takayama et al. |
| 7,158,104 B2 | 1/2007 | Koyama |
| 7,169,636 B2 | 1/2007 | Maruyama et al. |
| 7,180,091 B2 | 2/2007 | Yamazaki et al. |
| 7,189,631 B2 | 3/2007 | Yamazaki et al. |
| 7,241,666 B2 | 7/2007 | Goto et al. |
| 7,245,331 B2 | 7/2007 | Yamazaki et al. |
| 7,262,088 B2 | 8/2007 | Kodaira et al. |
| 7,271,076 B2 | 9/2007 | Yamazaki et al. |
| 7,282,380 B2 | 10/2007 | Maruyama et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,436,050 B2 | 10/2008 | Yamazaki et al. |
| 7,465,674 B2 | 12/2008 | Tamura et al. |
| 7,482,248 B2 | 1/2009 | Tamura |
| 7,521,293 B2 | 4/2009 | Ogata |
| 7,521,383 B2 | 4/2009 | Morisue et al. |
| 7,531,847 B2 | 5/2009 | Shitagaki et al. |
| 7,536,780 B2 | 5/2009 | Shimizu et al. |
| 7,540,079 B2 | 6/2009 | Okuyama et al. |
| 7,566,633 B2 | 7/2009 | Koyama et al. |
| 7,566,640 B2 | 7/2009 | Yamazaki et al. |
| 7,569,859 B2 | 8/2009 | Maruyama et al. |
| 7,591,863 B2 | 9/2009 | Watanabe et al. |
| 7,601,236 B2 | 10/2009 | Yamashita et al. |
| 7,608,520 B2 | 10/2009 | Sugita et al. |
| 7,723,209 B2 | 5/2010 | Maruyama et al. |
| 7,732,263 B2 | 6/2010 | Yamazaki et al. |
| 7,767,543 B2 | 8/2010 | Tateishi et al. |
| 7,820,526 B2 | 10/2010 | Yamada et al. |
| 7,867,907 B2 | 1/2011 | Shimomura et al. |
| 7,927,971 B2 | 4/2011 | Tamura et al. |
| 8,030,132 B2 | 10/2011 | Ogita et al. |
| 8,035,583 B2 | 10/2011 | Koyama |
| 8,043,936 B2 | 10/2011 | Eguchi et al. |
| 8,044,411 B2 | 10/2011 | Maruyama et al. |
| 8,048,770 B2 | 11/2011 | Eguchi et al. |
| 8,048,777 B2 | 11/2011 | Eguchi et al. |
| 8,058,083 B2 | 11/2011 | Eguchi et al. |
| 8,058,146 B2 | 11/2011 | Kuwabara |
| 8,110,442 B2 | 2/2012 | Jinbo |
| 8,222,116 B2 | 7/2012 | Jinbo et al. |
| 8,237,176 B2 | 8/2012 | Maruyama et al. |
| 8,367,440 B2 | 2/2013 | Takayama et al. |
| 8,482,011 B2 | 7/2013 | Maruyama et al. |
| 8,497,627 B2 | 7/2013 | Lee et al. |
| 8,508,439 B2 | 8/2013 | Koyama |
| 8,597,965 B2 | 12/2013 | Hatano et al. |
| 8,692,263 B2 | 4/2014 | Nam et al. |
| 8,785,964 B2 | 7/2014 | Shitagaki et al. |
| 8,803,136 B2 | 8/2014 | Yamazaki et al. |
| 8,823,023 B2 | 9/2014 | Jinbo et al. |
| 8,876,998 B2 | 11/2014 | Park et al. |
| 8,907,561 B2 | 12/2014 | Ryu et al. |
| 9,082,679 B2 | 7/2015 | Jinbo et al. |
| 9,147,859 B2 | 9/2015 | Kim et al. |
| 9,436,036 B2 | 9/2016 | Jinbo et al. |
| 9,489,884 B2 | 11/2016 | Koyama |
| 9,502,690 B2 | 11/2016 | Yamazaki et al. |
| 9,577,219 B2 | 2/2017 | Yamazaki et al. |
| 9,741,961 B2 | 8/2017 | Kim et al. |
| 9,773,998 B2 | 9/2017 | Chida et al. |
| 9,882,165 B2 | 1/2018 | Yamazaki et al. |
| 2003/0022403 A1 | 1/2003 | Shimoda et al. |
| 2003/0082889 A1 | 5/2003 | Maruyama et al. |
| 2004/0209442 A1 | 10/2004 | Takakuwa et al. |
| 2005/0176180 A1 | 8/2005 | Fay et al. |
| 2005/0214984 A1 | 9/2005 | Maruyama et al. |
| 2005/0229370 A1 | 10/2005 | Kobayashi |
| 2006/0199382 A1 | 9/2006 | Sugiyama et al. |
| 2007/0045621 A1 | 3/2007 | Suzuki et al. |
| 2007/0172971 A1 | 7/2007 | Boroson |
| 2007/0262403 A1 | 11/2007 | Tsurume |
| 2008/0011420 A1 | 1/2008 | Yoshizawa et al. |
| 2008/0042168 A1 | 2/2008 | Watanabe et al. |
| 2008/0044940 A1 | 2/2008 | Watanabe et al. |
| 2008/0113486 A1 | 5/2008 | Eguchi et al. |
| 2008/0132033 A1 | 6/2008 | Eguchi et al. |
| 2008/0182385 A1 | 7/2008 | Kamine |
| 2008/0259575 A1 | 10/2008 | Tanimura et al. |
| 2009/0023251 A1 | 1/2009 | Eguchi et al. |
| 2009/0059609 A1 | 3/2009 | Marshall et al. |
| 2009/0117389 A1 | 5/2009 | Amberg-Schwab et al. |
| 2009/0189511 A1 | 7/2009 | Yamazaki et al. |
| 2010/0096090 A1 | 4/2010 | Yoshioka et al. |
| 2010/0124795 A1 | 5/2010 | Eguchi et al. |
| 2012/0045861 A1 | 2/2012 | Eguchi et al. |
| 2012/0146061 A1 | 6/2012 | Nam et al. |
| 2013/0048967 A1 | 2/2013 | Nishido et al. |
| 2013/0048995 A1 | 2/2013 | Yamazaki et al. |
| 2013/0248828 A1 | 9/2013 | Schaepkens et al. |
| 2014/0061612 A1 | 3/2014 | Yamazaki et al. |
| 2015/0044792 A1 | 2/2015 | Aoyama et al. |
| 2015/0069358 A1* | 3/2015 | Chida ............... H10K 50/8426 257/40 |
| 2015/0076461 A1 | 3/2015 | Shitagaki et al. |
| 2016/0372356 A1 | 12/2016 | Jinbo et al. |
| 2017/0053974 A1 | 2/2017 | Koyama |

FOREIGN PATENT DOCUMENTS

| | | |
|---|---|---|
| CN | 001601713 A | 3/2005 |
| CN | 101030526 A | 9/2007 |
| CN | 102468452 A | 5/2012 |
| CN | 102544060 A | 7/2012 |
| CN | 102569347 A | 7/2012 |
| EP | 0 938 129 A1 | 8/1999 |
| EP | 1 437 777 A2 | 7/2004 |
| EP | 2 413 363 A2 | 2/2012 |
| JP | 10-125931 A | 5/1998 |
| JP | 2002-108285 A | 4/2002 |
| JP | 2003-174153 A | 6/2003 |
| JP | 2004-207234 A | 7/2004 |
| JP | 2006-128022 A | 5/2006 |
| JP | 2007-115705 A | 5/2007 |
| JP | 2010-040408 A | 2/2010 |
| JP | 2010-121144 A | 6/2010 |
| JP | 2010-140786 A | 6/2010 |
| JP | 2010-244698 A | 10/2010 |

(56) References Cited

FOREIGN PATENT DOCUMENTS

| | | |
|---|---|---|
| JP | 2011-053582 A | 3/2011 |
| JP | 2012-119301 A | 6/2012 |
| JP | 2012-142270 A | 7/2012 |
| JP | 2013-065549 A | 4/2013 |
| JP | 2015-109258 A | 6/2015 |
| KR | 2006-0031590 A | 4/2006 |
| KR | 2012-0127236 A | 11/2012 |
| TW | 201225728 | 6/2012 |
| TW | 201227680 | 7/2012 |

OTHER PUBLICATIONS

Dic6tionary Defintion of Perimeter. No Date.*
Chinese Office Action (Application No. 201410452553.0) Dated May 26, 2017.
Chinese Office Action (Application No. 201410452553.0) Dated Aug. 8, 2018.
Taiwanese Office Action (Application No. 103129720) Dated Sep. 6, 2018.
Chinese Office Action (Application No. 201910146282.9) Dated Sep. 2, 2020.

* cited by examiner

FIG. 3A1
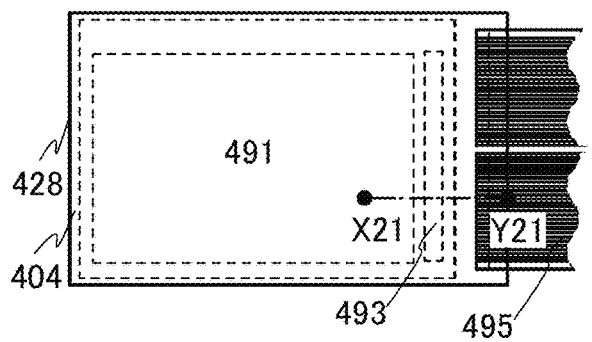
FIG. 3A2
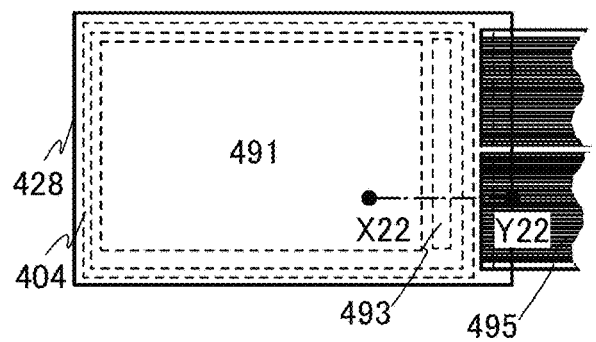
FIG. 3B
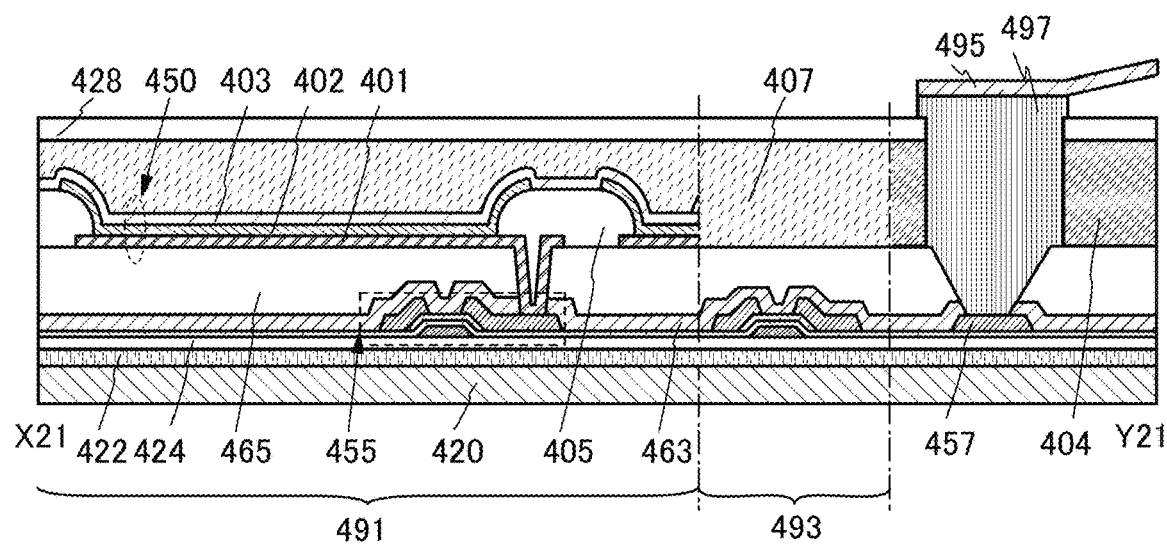
FIG. 3C
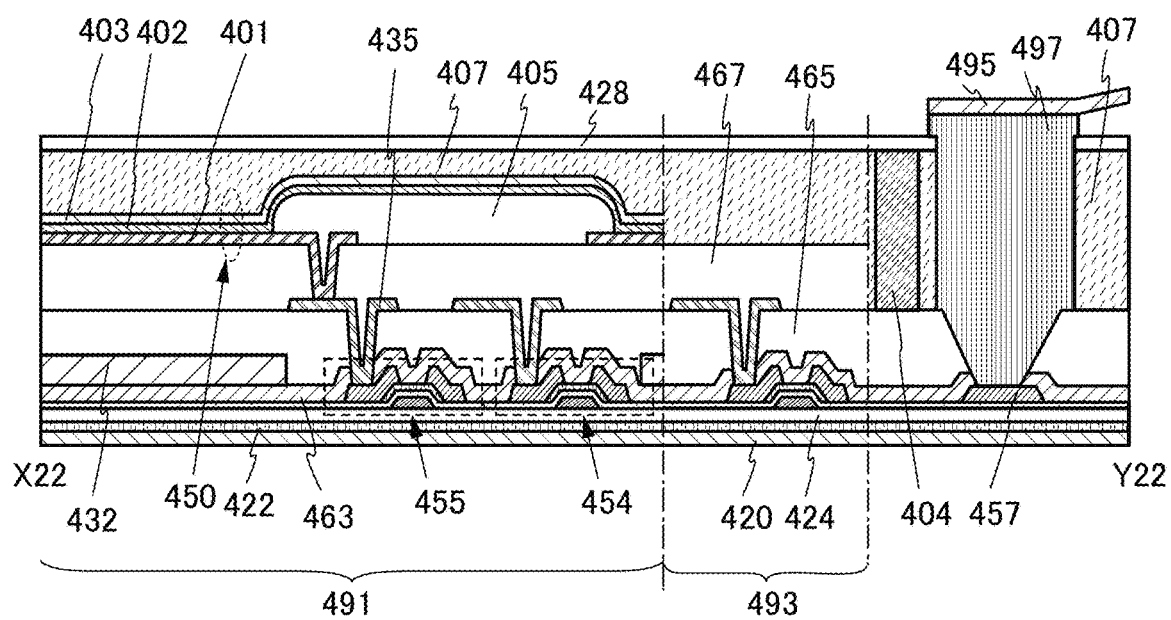

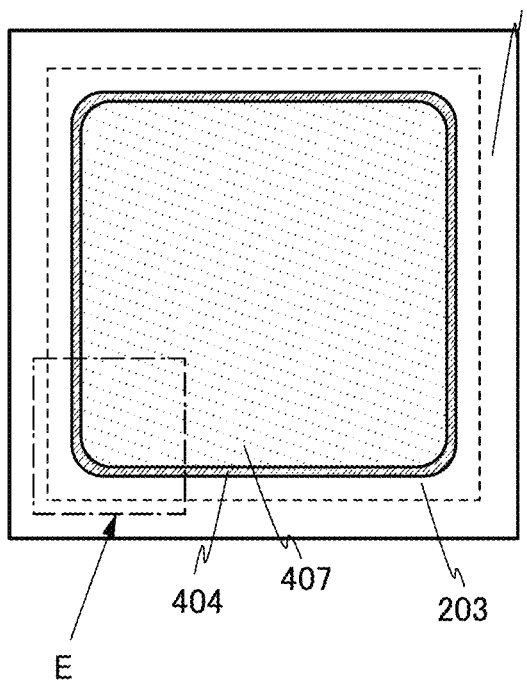
FIG. 11A
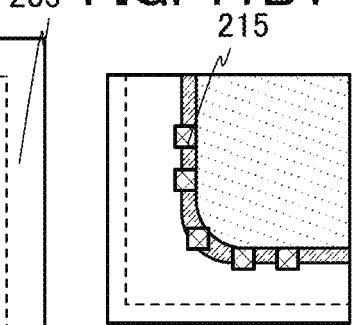
FIG. 11B1
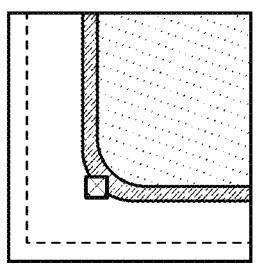
FIG. 11B2
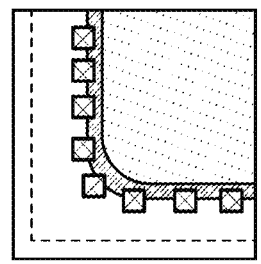
FIG. 11B3
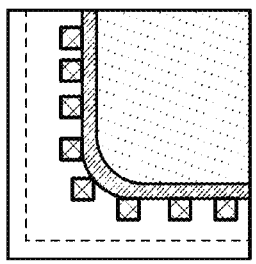
FIG. 11B4
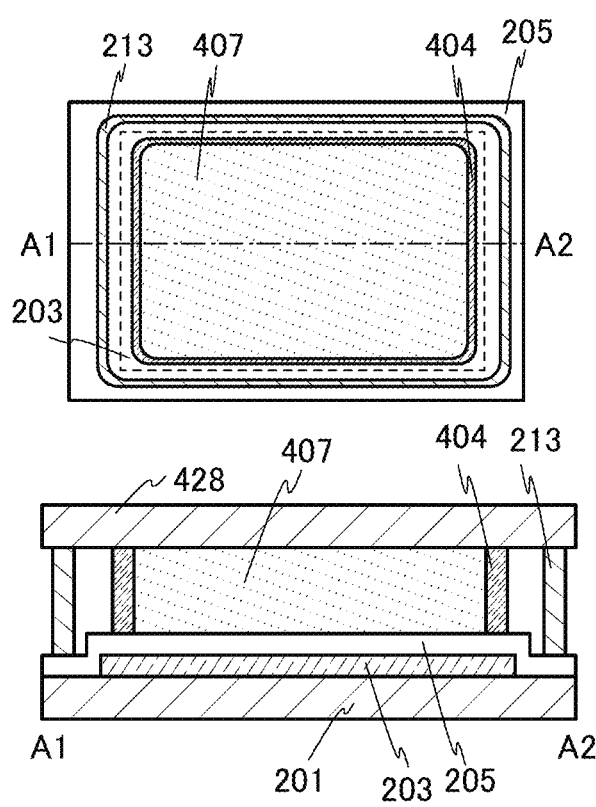
FIG. 11C

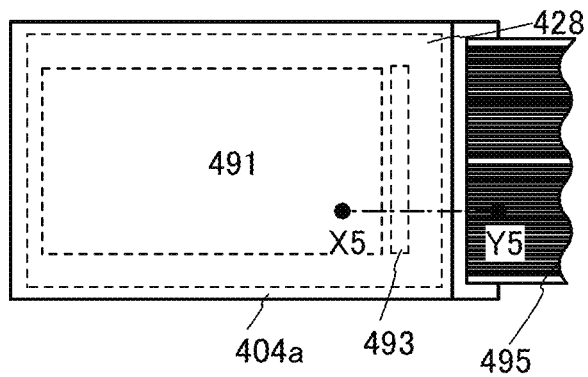
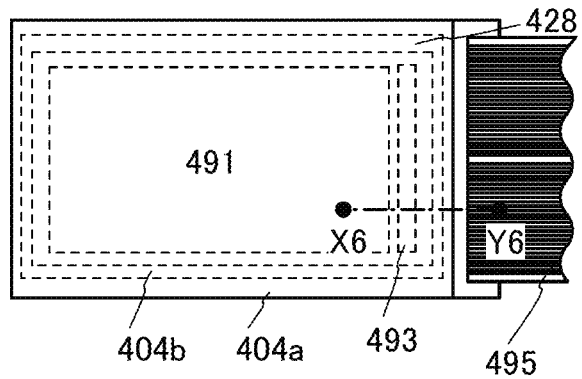
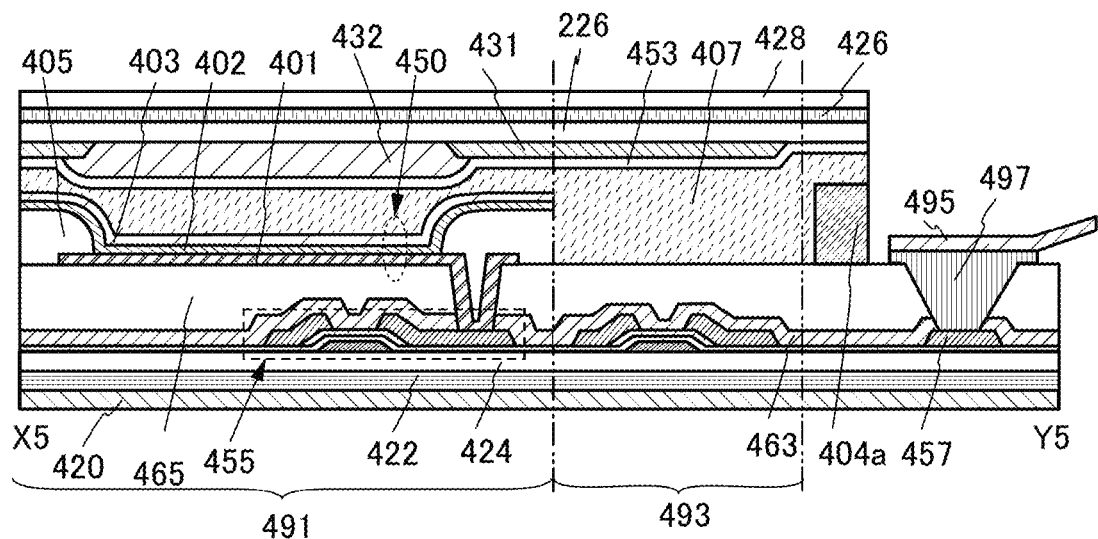
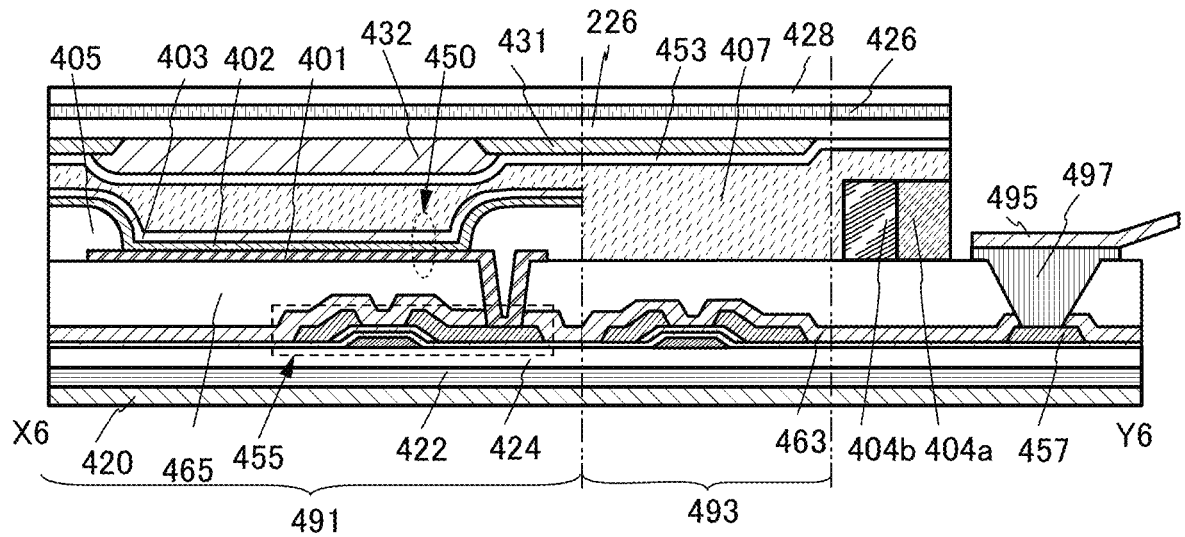

FIG. 19A
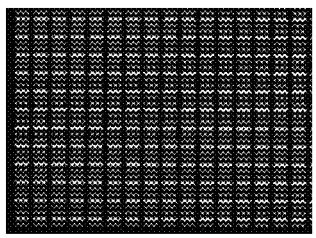
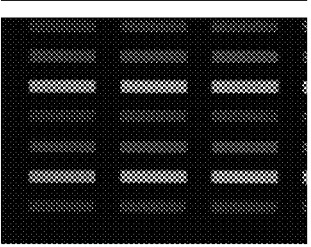
FIG. 19B
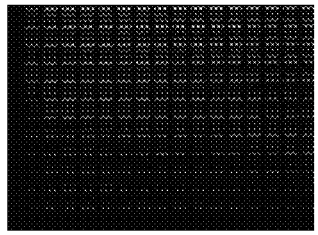
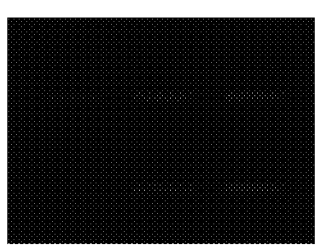
FIG. 19C
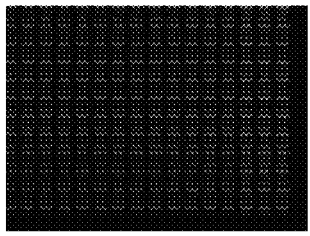
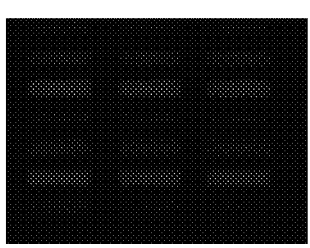
FIG. 19D
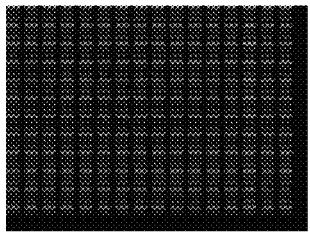
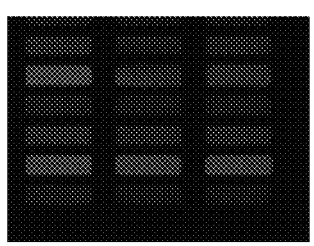
FIG. 19E
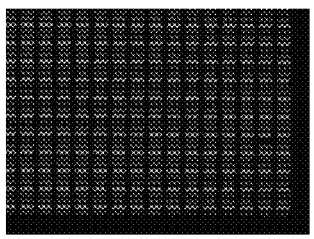
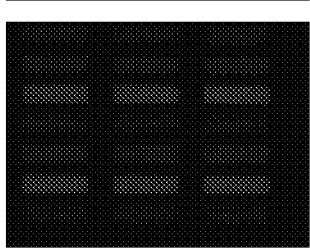
FIG. 19F
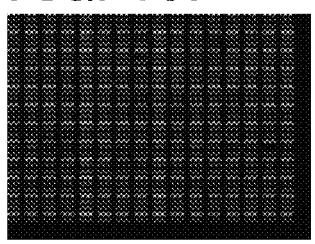
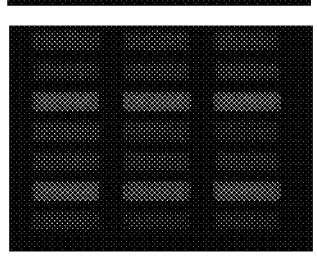
FIG. 19G
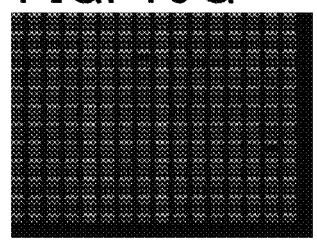

FIG. 21A
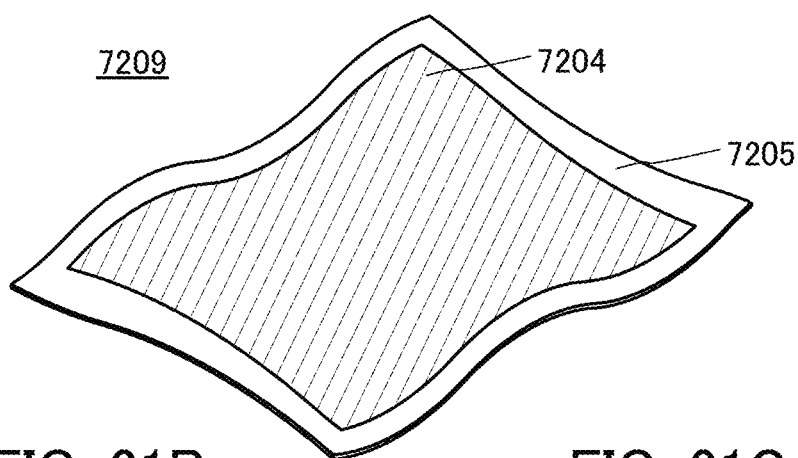
FIG. 21B
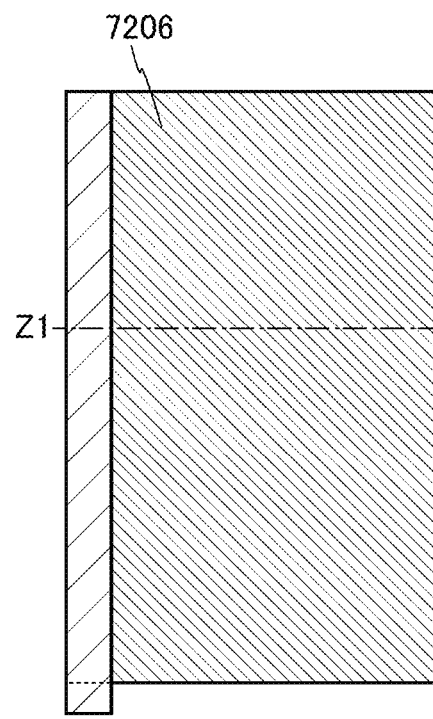
FIG. 21C
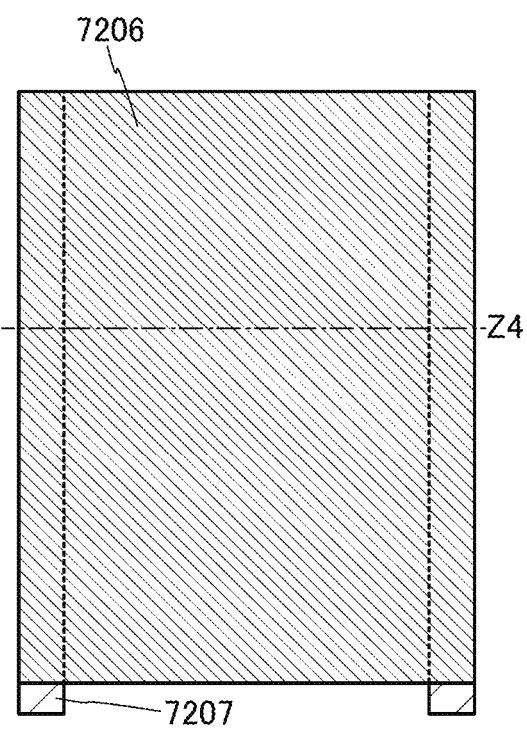
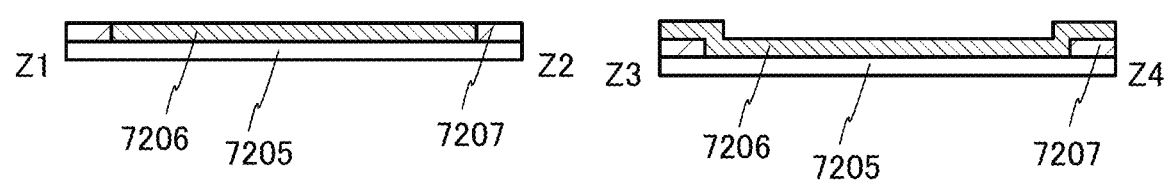
FIG. 21D
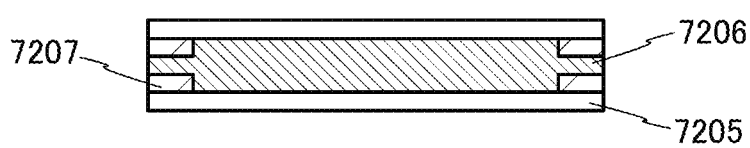

404  407  223

404  407  223

404  407  223

404  407  223

LIGHT-EMITTING DEVICE AND METHOD FOR MANUFACTURING LIGHT-EMITTING DEVICE

This application is a continuation of copending U.S. application Ser. No. 16/900,034, filed on Jun. 12, 2020 which is a continuation of U.S. application Ser. No. 15/707,383, filed on Sep. 18, 2017 (now U.S. Pat. No. 10,686,157 issued Jun. 16, 2020) which is a divisional of U.S. application Ser. No. 14/476,154, filed on Sep. 3, 2014 (now U.S. Pat. No. 9,773,998 issued Sep. 26, 2017) which are all incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a light-emitting device, a display device, an electronic device, a lighting device, and a manufacturing method thereof. In particular, one embodiment of the present invention relates to a light-emitting device utilizing organic electroluminescence (EL), and a method for manufacturing the light-emitting device.

2. Description of the Related Art

Recent light-emitting devices and display devices are expected to be applied to a variety of uses and become diversified.

For example, light-emitting devices and display devices for mobile devices and the like are required to be thin, lightweight, and unlikely to be broken.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been suggested.

For example, Patent Document 1 discloses a flexible active matrix light-emitting device in which an organic EL element and a transistor serving as a switching element are provided over a film substrate.

However, an organic EL element has a problem in that entry of impurities such as moisture or oxygen from the outside erodes the reliability.

In addition, when impurities such as moisture or oxygen enter an organic compound or a metal material contained in an organic EL element from the outside of the organic EL element, the lifetime of the organic EL element is significantly shortened in some cases. This is because an organic compound or a metal material contained in the organic EL element reacts with the impurities such as moisture or oxygen and thus deteriorates.

Thus, a technique to seal an organic EL element for preventing entry of impurities has been researched and developed.

REFERENCE

Patent Document

[Patent Document 1] Japanese Published Patent Application No. 2003-174153

SUMMARY OF THE INVENTION

An object of one embodiment of the present invention is to provide a highly reliable flexible device such as a light-emitting device, a display device, an electronic device, or a lighting device.

An object of one embodiment of the present invention is to improve the yield of a manufacturing process of a highly reliable flexible light-emitting device. An object of one embodiment of the present invention is to prevent entry of impurities in the manufacturing process of the light-emitting device.

An object of one embodiment of the present invention is to provide a novel device such as a light-emitting device, a display device, an electronic device, or a lighting device. An object of one embodiment of the present invention is to provide a light device such as a light-emitting device, a display device, an electronic device, or a lighting device. An object of one embodiment of the present invention is to provide a device that is less likely to be broken, such as a light-emitting device, a display device, an electronic device, or a lighting device. An object of one embodiment of the present invention is to provide a thin device such as a light-emitting device, a display device, an electronic device, or a lighting device.

Note that the descriptions of these objects do not disturb the existence of other objects. In one embodiment of the present invention, there is no need to achieve all the objects. Other objects will be apparent from the description of the specification, the drawings, the claims, and the like and other objects can be derived from the description of the specification, the drawings, the claims, and the like.

A light-emitting device of one embodiment of the present invention includes a first flexible substrate, a second flexible substrate, a light-emitting element between the first flexible substrate and the second flexible substrate, a first bonding layer, and a second bonding layer in a frame shape surrounding the first bonding layer. The first bonding layer and the second bonding layer are between the second flexible substrate and the light-emitting element. The light-emitting element includes a layer containing a light-emitting organic compound between a pair of electrodes. The second bonding layer has a higher gas barrier property than the first bonding layer.

A light-emitting device of one embodiment of the present invention includes a first flexible substrate, a second flexible substrate, a transistor between the first flexible substrate and the second flexible substrate, a light-emitting element between the transistor and the second flexible substrate, an adhesive layer between the first flexible substrate and the transistor, a first bonding layer, and a second bonding layer in a frame shape surrounding the first bonding layer. The first bonding layer and the second bonding layer are between the second flexible substrate and the light-emitting element. The light-emitting element includes a layer containing a light-emitting organic compound between a pair of electrodes. The second bonding layer has a higher gas barrier property than the first bonding layer.

A light-emitting device of one embodiment of the present invention includes a first flexible substrate, a second flexible substrate, an insulating layer having a high gas barrier property between the first flexible substrate and the second flexible substrate, a light-emitting element between the insulating layer and the second flexible substrate, an adhesive layer between the first flexible substrate and the insulating layer, a first bonding layer, and a second bonding layer in a frame shape surrounding the first bonding layer. The first bonding layer and the second bonding layer are between the second flexible substrate and the light-emitting element. The light-emitting element includes a layer containing a light-emitting organic compound between a pair of electrodes. The second bonding layer has a higher gas barrier property than the first bonding layer.

A light-emitting device of one embodiment of the present invention includes a first flexible substrate, a second flexible substrate, a first insulating layer having a high gas barrier property between the first flexible substrate and the second flexible substrate, a transistor between the first insulating layer and the second flexible substrate, a light-emitting element between the transistor and the second flexible substrate, a coloring layer between the light-emitting element and the second flexible substrate, a second insulating layer having a high gas barrier property between the coloring layer and the second flexible substrate, a first adhesive layer between the first flexible substrate and the first insulating layer, a first bonding layer, a second bonding layer in a frame shape surrounding the first bonding layer, and a second adhesive layer between the second insulating layer and the second flexible substrate. The first bonding layer and the second bonding layer are between the coloring layer and the light-emitting element. The light-emitting element includes a layer containing a light-emitting organic compound between a pair of electrodes. The first bonding layer, the coloring layer, the second insulating layer, the second adhesive layer, and the second flexible substrate transmit light emitted from the light-emitting element. The second bonding layer has a higher gas barrier property than the first bonding layer.

An electronic device including the light-emitting device with the above structure in a display portion is also one embodiment of the present invention.

A lighting device including the light-emitting device with the above structure in a light-emitting portion is also one embodiment of the present invention.

Note that the light-emitting device in this specification includes, in its category, a display device using a light-emitting element. Furthermore, the category of the light-emitting device in this specification includes a module in which a light-emitting element is provided with a connector such as an anisotropic conductive film or a TCP (tape carrier package); a module having a TCP at the tip of which a printed wiring board is provided; and a module in which an IC (integrated circuit) is directly mounted on a light-emitting element by a COG (chip on glass) method. The light-emitting device also includes the one used in lighting equipment and the like.

One embodiment of the present invention can provide a novel device such as a light-emitting device, a display device, an electronic device, or a lighting device. One embodiment of the present invention can provide a highly reliable flexible device such as a light-emitting device, a display device, an electronic device, or a lighting device.

One embodiment of the present invention can improve the yield of a manufacturing process of a highly reliable flexible light-emitting device. One embodiment of the present invention can prevent entry of impurities in the manufacturing process of the light-emitting device.

Note that the descriptions of these effects do not disturb the existence of other effects. In one embodiment of the present invention, there is no need to have all the effects. Other effects will be apparent from the description of the specification, the drawings, the claims, and the like and other effects can be derived from the description of the specification, the drawings, the claims, and the like.

BRIEF DESCRIPTION OF THE DRAWINGS

FIGS. 3A1, 3A2, 3B, and 3C each illustrate an example of a light-emitting device.

FIGS. 11A, 11B1, 11B2, 11B3, 11B4, and 11C illustrate an example of a method for manufacturing a light-emitting device.

FIGS. 17A1, 17A2, 17B, and 17C each illustrate a light-emitting device, which is a sample in Example.

FIGS. 19A to 19G are photographs of light-emitting devices in Example.

FIGS. 21A to 21D each illustrate an example of a light-emitting device that can be used in a light-emitting portion.

DETAILED DESCRIPTION OF THE INVENTION

Figure 1A:
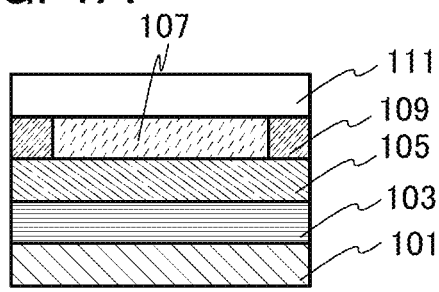
FIGS. 1A to 1C each illustrate an example of a light-emitting device.

Embodiments and an example will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments and the example below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

Embodiment 1

In this embodiment, a flexible light-emitting device of one embodiment of the present invention and a method for manufacturing the light-emitting device will be described with reference to FIGS. 1A to 1C, FIGS. 2A to 2C, FIGS. 3A1, 3A2, 3B, and 3C, FIGS. 4A and 4B, FIGS. 5A and 5B, FIGS. 6A to 6D, FIGS. 7A to 7D, FIGS. 8A to 8D, FIGS. 9A to 9D, FIGS. 10A to 10D, FIGS. 11A, 11B1, 11B2, 11B3, 11B4, and 11C, and FIGS. 12A to 12F.

The light-emitting device of one embodiment of the present invention includes a light-emitting element sealed by a pair of flexible substrates and a bonding layer.

The bonding layer is not covered at a side surface of the light-emitting device. For this reason, impurities such as moisture and oxygen enter an organic EL element from the outside when the bonding layer has a low gas barrier property. The entry of impurities into the organic EL element causes, for example, shrinkage of a light-emitting portion (here, luminance degradation from an end portion of the light-emitting portion, or an increase in a non-light-emitting region in the light-emitting portion). Thus, the bonding layer that covers the organic EL element preferably has a high gas barrier property (in particular, a low water vapor and oxygen permeability).

In the case where a liquid composition whose volume is greatly reduced by curing is used as a material of the bonding layer, a stress is applied to the organic EL element, which might damage the organic EL element and cause a defect in light emission. Thus, a reduction in the volume due to curing of a material used for the bonding layer is preferably as small as possible.

In the case where the bonding layer is positioned on the side from which light emitted from the organic EL element is extracted, the light-transmitting property of the bonding layer is preferably high so that the light extraction efficiency of the light-emitting device is increased. For a similar purpose, the refractive index of the bonding layer is preferably high.

There are a plurality of properties that are required for the bonding layer as described above, and it is very difficult for a material of the bonding layer to exhibit two or more of those properties.

In view of the above, the light-emitting device of one embodiment of the present invention includes two kinds of bonding layers between a flexible substrate and an organic EL element. Specifically, for example, one bonding layer having a higher gas barrier property than the other bonding layer surrounds the other. A material of the outer bonding layer has a higher gas barrier property than a material of the inner bonding layer. Thus, even when a material having a low gas barrier property and having a small reduction in volume due to curing, a high light-transmitting property (visible light transmittance, in particular), or a high refractive index is used for the inner bonding layer, for example, moisture and oxygen can be prevented from entering the light-emitting device from the outside. Accordingly, a highly reliable light-emitting device in which shrinkage of a light-emitting portion is suppressed can be obtained.

The permeation amount of gas, oxygen, or water vapor of the layer having a high gas barrier property is, for example, lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

Figure 1B:
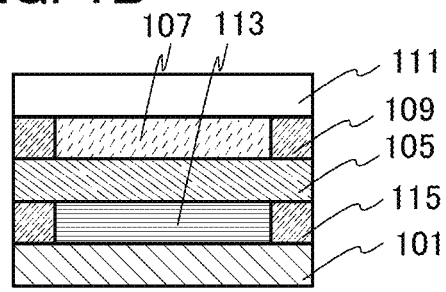
Figure 1C:
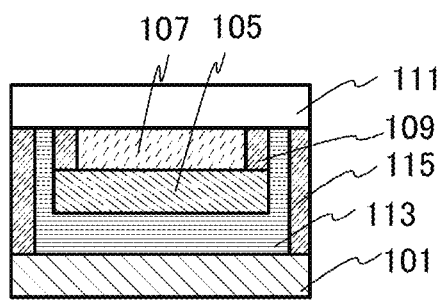

FIGS. 1A to 1C each illustrate the light-emitting device of one embodiment of the present invention.

The light-emitting device illustrated in FIG. 1A includes a first flexible substrate 101, a second flexible substrate 111, an element layer 105 between the first flexible substrate 101 and the second flexible substrate 111, an adhesive layer 103 between the first flexible substrate 101 and the element layer 105, a first bonding layer 107, and a second bonding layer 109 in a frame shape surrounding the first bonding layer 107. The first bonding layer 107 and the second bonding layer 109 are between the second flexible substrate 111 and the element layer 105. The element layer 105 includes an organic EL element.

The second bonding layer 109 has a higher gas barrier property than the first bonding layer 107. The permeation amount of gas, oxygen, or water vapor of the second bonding layer 109 is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day], for example.

The shortest distance in the thickness direction between the organic EL element and the first bonding layer 107 is preferably shorter than that between the organic EL element and the adhesive layer 103. Even when the distance in the thickness direction between the organic EL element and the first bonding layer 107 is short, the entry of impurities into the organic EL element can be prevented because the first bonding layer 107 is surrounded by the second bonding layer 109 having a higher gas barrier property.

The element layer 105 may include, for example, a transistor between the adhesive layer 103 and the first bonding layer 107, and the organic EL element between the transistor and the first bonding layer 107. Alternatively, the element layer 105 may include an insulating layer between the adhesive layer 103 and the first bonding layer 107, and the organic EL element between the insulating layer and the first bonding layer 107, for example. In that case, the insulating layer preferably has a high gas barrier property. The insulating layer can prevent the entry of impurities into the organic EL element from the first flexible substrate 101 side. The insulating layer may be provided between the adhesive layer 103 and the transistor or between the transistor and the organic EL element. Alternatively, the insulating layer may be included in the transistor.

The light-emitting devices illustrated in FIGS. 1B and 1C each include the first flexible substrate 101, the second flexible substrate 111, the element layer 105 between the first flexible substrate 101 and the second flexible substrate 111, a third bonding layer 113, a fourth bonding layer 115 in a frame shape surrounding the third bonding layer 113, the first bonding layer 107, and the second bonding layer 109 in a frame shape surrounding the first bonding layer 107. The third bonding layer 113 and the fourth bonding layer 115 are between the first flexible substrate 101 and the element layer 105. The first bonding layer 107 and the second bonding layer 109 are between the second flexible substrate 111 and the element layer 105. The element layer 105 includes an organic EL element. The second bonding layer 109 has a higher gas barrier property than the first bonding layer 107, and the fourth bonding layer 115 has a higher gas barrier property than the third bonding layer 113.

The light-emitting device of one embodiment of the present invention can have a structure in which the second bonding layer 109 and the fourth bonding layer 115 are not covered at a side surface of the light-emitting device, as illustrated in FIG. 1B. Alternatively, a structure can be employed in which one of the second bonding layer 109 and the fourth bonding layer 115 covers the other and one of the second bonding layer 109 and the fourth bonding layer 115 is not covered at a side surface of the light-emitting device, as illustrated in FIG. 1C.

Specific structural examples will be described below.

Structural Example 1

Figure 2A:
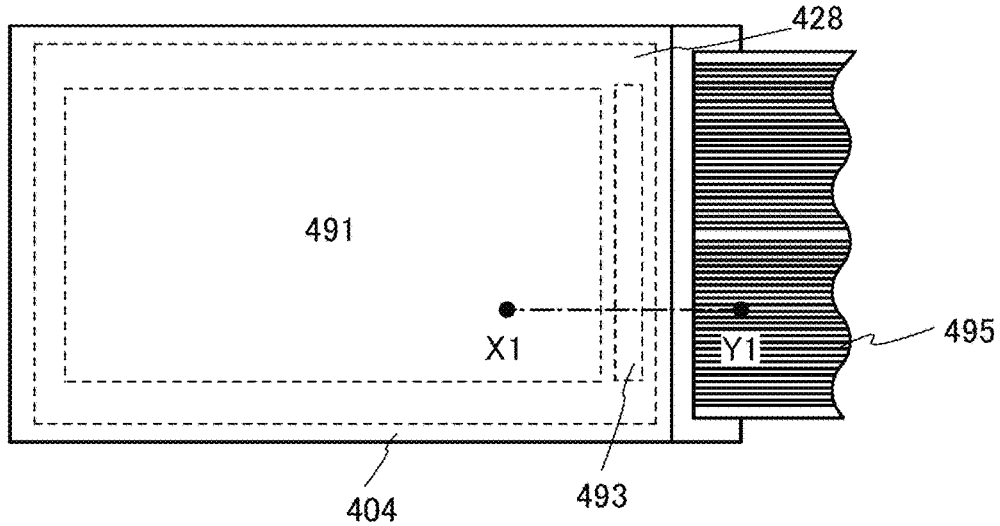
FIGS. 2A to 2C each illustrate an example of a light-emitting device.
Figure 2B:
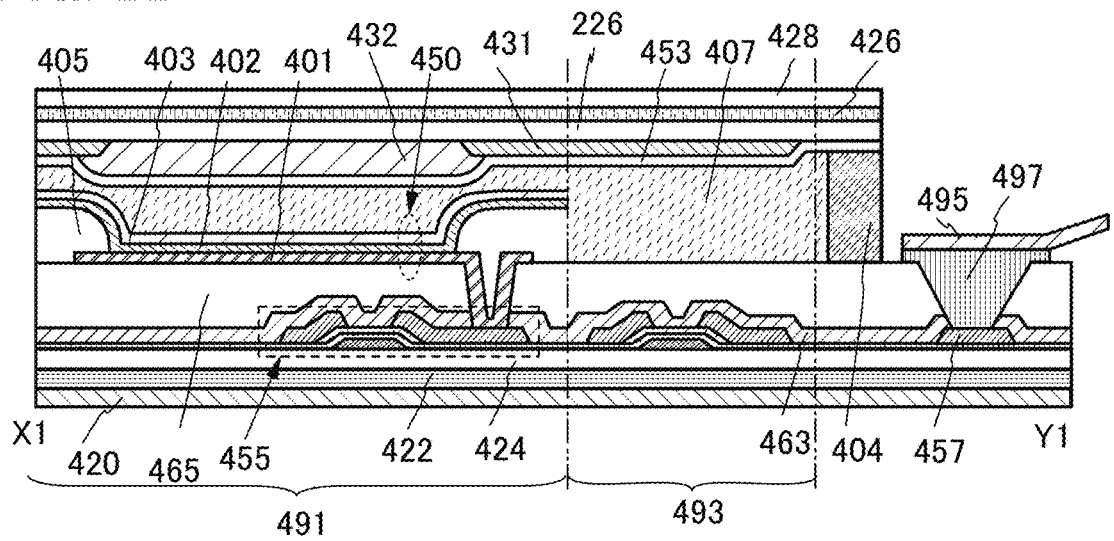
Figure 2C:
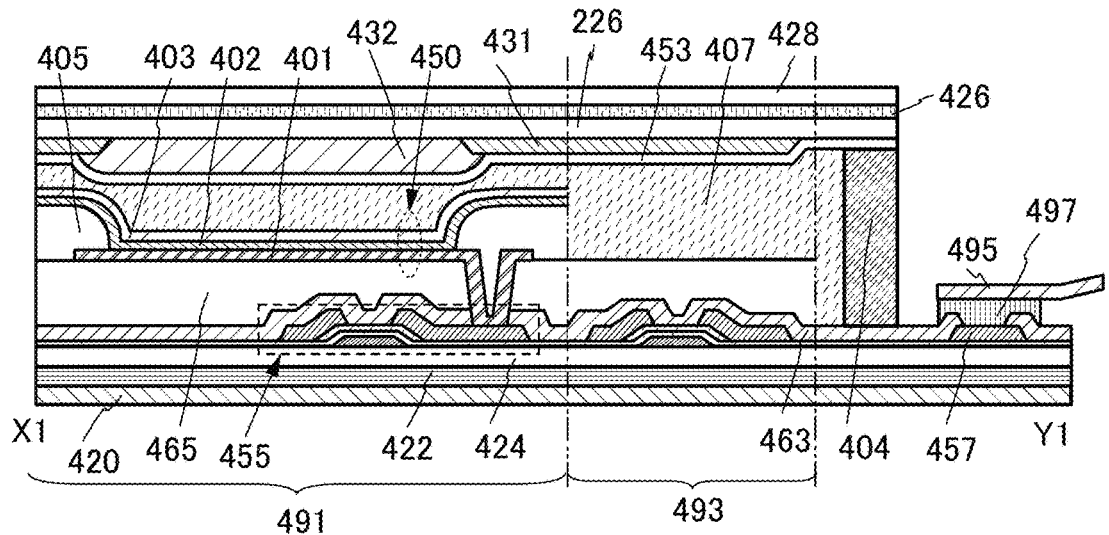

FIG. 2A is a plan view of a light-emitting device. FIGS. 2B and 2C are each an example of a cross-sectional view taken along dashed-dotted line X1-Y1 in FIG. 2A. The light-emitting devices illustrated in FIGS. 2A to 2C are top-emission light-emitting devices using a color filter method.

The light-emitting device illustrated in FIG. 2A includes a light-emitting portion 491, a driver circuit portion 493, and a flexible printed circuit (FPC) 495. An organic EL element and a transistor included in the light-emitting portion 491 and the driver circuit portion 493 are sealed by a flexible substrate 420, a flexible substrate 428, a first bonding layer 407, and a second bonding layer 404.

The light-emitting devices illustrated in FIGS. 2B and 2C each include the flexible substrate 420, an adhesive layer 422, an insulating layer 424, a transistor 455, an insulating layer 463, an insulating layer 465, an insulating layer 405, an organic EL element 450 (a first electrode 401, an EL layer 402, and a second electrode 403), the first bonding layer 407, the second bonding layer 404, an overcoat 453, a light-blocking layer 431, a coloring layer 432, an insulating layer 226, an adhesive layer 426, the flexible substrate 428, and a conductive layer 457. The flexible substrate 428, the adhesive layer 426, the insulating layer 226, the first bonding layer 407, the overcoat 453, and the second electrode 403 transmit visible light.

In the light-emitting portion 491 of the light-emitting device illustrated in FIGS. 2B and 2C, the transistor 455 and the organic EL element 450 are provided over the flexible substrate 420 with the bonding layer 422 and the insulating layer 424 provided therebetween. The organic EL element 450 includes the first electrode 401 over the insulating layer 465, the EL layer 402 over the first electrode 401, and the second electrode 403 over the EL layer 402. The first electrode 401 is electrically connected to the source electrode or the drain electrode of the transistor 455. The end portion of the first electrode 401 is covered with the insulating layer 405. It is preferable that the first electrode 401 reflect visible light. Moreover, the light-emitting device includes the coloring layer 432 overlapping with the organic EL element 450 with the first bonding layer 407 provided therebetween, and the light-blocking layer 431 overlapping with the insulating layer 405 with the first bonding layer 407 provided therebetween.

The driver circuit portion 493 includes a plurality of transistors. In each of FIGS. 2B and 2C, one of the transistors included in the driver circuit portion 493 is illustrated. An example where the driver circuit portion 493 is positioned on an inner side than the second bonding layer 404 in a frame shape is described in this embodiment; however, the driver circuit portion 493 may be positioned on an outer side than the second bonding layer 404.

The conductive layer 457 is electrically connected to an external input terminal through which a signal (e.g., a video signal, a clock signal, a start signal, and a reset signal) or a potential from the outside is transmitted to the driver circuit portion 493. Here, an example in which the FPC 495 is provided as the external input terminal is described. Moreover, here, an example in which the conductive layer 457 is formed using the same material and the same step(s) as those of the source electrode and the drain electrode of the transistor 455 is described. A connector 497 over the insulating layer 226 is connected to the conductive layer 457. Moreover, the connector 497 is connected to the FPC 495. The FPC 495 and the conductive layer 457 are electrically connected to each other with the connector 497 provided therebetween.

The conductive layer 457 is preferably positioned on an outer side than the second bonding layer 404 because the entry of impurities such as moisture into the organic EL element 450 can be prevented even in the case where moisture and the like easily enter from a connection portion between the FPC 495 and the connector 497 and a connection portion between the connector 497 and the conductive layer 457.

The insulating layer 463 has an effect of suppressing diffusion of impurities into a semiconductor included in the transistor. As the insulating layer 465, an insulating layer having a planarization function is preferably selected in order to reduce surface unevenness due to the transistor.

The light-emitting device illustrated in FIG. 2C is different from that in FIG. 2B in that the insulating layer 465 is covered at a side surface of the light-emitting device. In the case of using an organic insulating material or the like having a low gas barrier property as a material of the insulating layer 465, the insulating layer 465 is preferably covered at the side surface of the light-emitting device. In addition, the second bonding layer 404 having a high gas barrier property is preferably positioned at the side surface of the light-emitting device to increase the reliability of the light-emitting device. Note that the insulating layer 465 is not necessarily covered at an end portion of the light-emitting device depending on a material or the like for the insulating layer 465, as illustrated in FIG. 2B.

The second bonding layer 404 has a higher gas barrier property than the first bonding layer 407. Thus, moisture and oxygen can be prevented from entering the light-emitting device through the side surface of the light-emitting device. Thus, the light-emitting device can be highly reliable.

In Structural Example 1, light emission of the organic EL element 450 is extracted from the light-emitting device through the first bonding layer 407. For this reason, the first bonding layer 407 preferably has a higher light-transmitting property than the second bonding layer 404. Furthermore, the first bonding layer 407 preferably has a higher refractive index than the second bonding layer 404. In addition, it is preferable that the volume of the first bonding layer 407 be less reduced by curing than that of the second bonding layer 404.

The insulating layer 424 preferably has a high gas barrier property to prevent moisture and oxygen from entering the light-emitting device from the flexible substrate 420 side. Similarly, the insulating layer 226 preferably has a high gas barrier property to prevent moisture and oxygen from entering the light-emitting device from the flexible substrate 428 side.

Structural Example 2

FIG. 3A1 is a plan view of the light-emitting device, and FIG. 3B is a cross-sectional view taken along dashed-dotted line X21-Y21 in FIG. 3A1. The light-emitting device illustrated in FIG. 3B is a top-emission light-emitting device using a separate coloring method.

The light-emitting device illustrated in FIG. 3A1 includes the light-emitting portion 491, the driver circuit portion 493, and the FPC 495. An organic EL element and a transistor included in the light-emitting portion 491 and the driver circuit portion 493 are sealed by the flexible substrate 420, the flexible substrate 428, the first bonding layer 407, and the second bonding layer 404. FIG. 3B illustrates an example where the conductive layer 457 and the connector 497 are connected to each other through an opening portion of the second bonding layer 404.

The light-emitting device illustrated in FIG. 3B includes the flexible substrate 420, the adhesive layer 422, the insulating layer 424, the transistor 455, the insulating layer 463, the insulating layer 465, the insulating layer 405, the organic EL element 450 (the first electrode 401, the EL layer 402, and the second electrode 403), the second bonding layer 404, the first bonding layer 407, the flexible substrate 428, and the conductive layer 457. The flexible substrate 428, the first bonding layer 407, and the second electrode 403 transmit visible light.

In the light-emitting portion 491 of the light-emitting device illustrated in FIG. 3B, the transistor 455 and the organic EL element 450 are provided over the flexible substrate 420 with the bonding layer 422 and the insulating layer 424 provided therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. It is preferable that the first electrode 401 reflect visible light. The end portion of the first electrode 401 is covered with the insulating layer 405.

The driver circuit portion 493 includes a plurality of transistors. FIG. 3B illustrates one of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described.

To prevent an increase in the number of manufacturing steps, the conductive layer 457 is preferably formed using the same material and the same step(s) as those of the electrode or the wiring in the light-emitting portion or the driver circuit portion. Here, an example in which the conductive layer 457 is formed using the same material and the same step(s) as those of the source electrode and the drain electrode of the transistor 455 is described.

The second bonding layer 404 has a higher gas barrier property than the first bonding layer 407. Thus, moisture and oxygen from the outside can be prevented from entering the light-emitting device. Thus, the light-emitting device can be highly reliable.

In Structural Example 2, light emission of the organic EL element 450 is extracted from the light-emitting device through the first bonding layer 407. For this reason, the first bonding layer 407 preferably has a higher light-transmitting property than the second bonding layer 404. Furthermore, the first bonding layer 407 preferably has a higher refractive index than the second bonding layer 404. In addition, it is preferable that the volume of the first bonding layer 407 be less reduced by curing than that of the second bonding layer 404.

Structural Example 3

FIG. 3A2 is a plan view of the light-emitting device, and FIG. 3C is a cross-sectional view taken along dashed-dotted line X22-Y22 in FIG. 3A2. The light-emitting device illustrated in FIG. 3C is a bottom-emission light-emitting device using a color filter method.

The light-emitting device illustrated in FIG. 3C includes the flexible substrate 420, the adhesive layer 422, the insulating layer 424, a transistor 454, the transistor 455, the insulating layer 463, the coloring layer 432, the insulating layer 465, a conductive layer 435, an insulating layer 467, the insulating layer 405, the organic EL element 450 (the first electrode 401, the EL layer 402, and the second electrode 403), the second bonding layer 404, the first bonding layer 407, the flexible substrate 428, and the conductive layer 457. The flexible substrate 420, the adhesive layer 422, the insulating layer 424, the insulating layer 463, the insulating layer 465, the insulating layer 467, and the first electrode 401 transmit visible light.

In the light-emitting portion 491 of the light-emitting device illustrated in FIG. 3C, the switching transistor 454, the current control transistor 455, and the organic EL element 450 are provided over the flexible substrate 420 with the bonding layer 422 and the insulating layer 424 provided therebetween. The organic EL element 450 includes the first electrode 401 over the insulating layer 467, the EL layer 402 over the first electrode 401, and the second electrode 403 over the EL layer 402. The first electrode 401 is electrically connected to the source electrode or the drain electrode of the transistor 455 through the conductive layer 435. The end portion of the first electrode 401 is covered with the insulating layer 405. It is preferable that the second electrode 403 reflect visible light. Moreover, the light-emitting device includes the coloring layer 432 over the insulating layer 463, with which the organic EL element 450 overlaps.

The driver circuit portion 493 includes a plurality of transistors. In FIG. 3C, one of the transistors included in the driver circuit portion 493 is illustrated.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and the same step(s) as those of the source electrode and the drain electrode of the transistor 455 is described.

FIG. 3C illustrates an example where the first bonding layer 407 in a frame shape is also provided on an outer side than the second bonding layer 404 in a frame shape, and the conductive layer 457 and the connector 497 are connected to each other in an opening portion of the first bonding layer 407 in a frame shape.

In the opening portion of the first bonding layer 407, which is positioned on an outer side than the second bonding layer 404 and has a lower gas barrier property than the second bonding layer 404, moisture and the like might enter easily from a connection portion between the FPC 495 and the connector 497, a connection portion between the connector 497 and the conductive layer 457, and the like.

However, impurities such as moisture can be prevented from entering the organic EL element 450 because the second bonding layer 404 having a high gas barrier property is positioned between the organic EL element 450 and the connection portions, which is preferable.

The insulating layer 463 has an effect of suppressing diffusion of impurities into a semiconductor included in the transistors. As the insulating layer 465 and the insulating layer 467, an insulating layer having a planarization function is preferably selected in order to reduce surface unevenness due to the transistors and the wirings.

The second bonding layer 404 has a higher gas barrier property than the first bonding layer 407. Thus, moisture and oxygen from the outside can be prevented from entering the light-emitting device. Thus, the light-emitting device can be highly reliable.

In Structural Example 3, it is preferable that the volume of the first bonding layer 407 be less reduced by curing than that of the second bonding layer 404.

Note that in one embodiment of the present invention, an active matrix method in which an active element is included in a pixel or a passive matrix method in which an active element (non-linear element) is not included in a pixel can be used.

In an active matrix method, as an active element, not only a transistor but also various active elements can be used. For example, a metal insulator metal (MIM), a thin film diode (TFD), or the like can also be used. Since these elements can be formed with a smaller number of manufacturing steps, manufacturing cost can be reduced or yield can be improved. Furthermore, since the size of these elements is small, the aperture ratio can be improved, so that power consumption can be reduced or higher luminance can be achieved.

Since an active element is not used in a passive matrix method, the number of manufacturing steps is small, so that the manufacturing cost can be reduced or the yield can be improved. Furthermore, since an active element is not used, the aperture ratio can be improved, so that power consumption can be reduced or higher luminance can be achieved, for example.

Structural Example 4

Figure 4A:
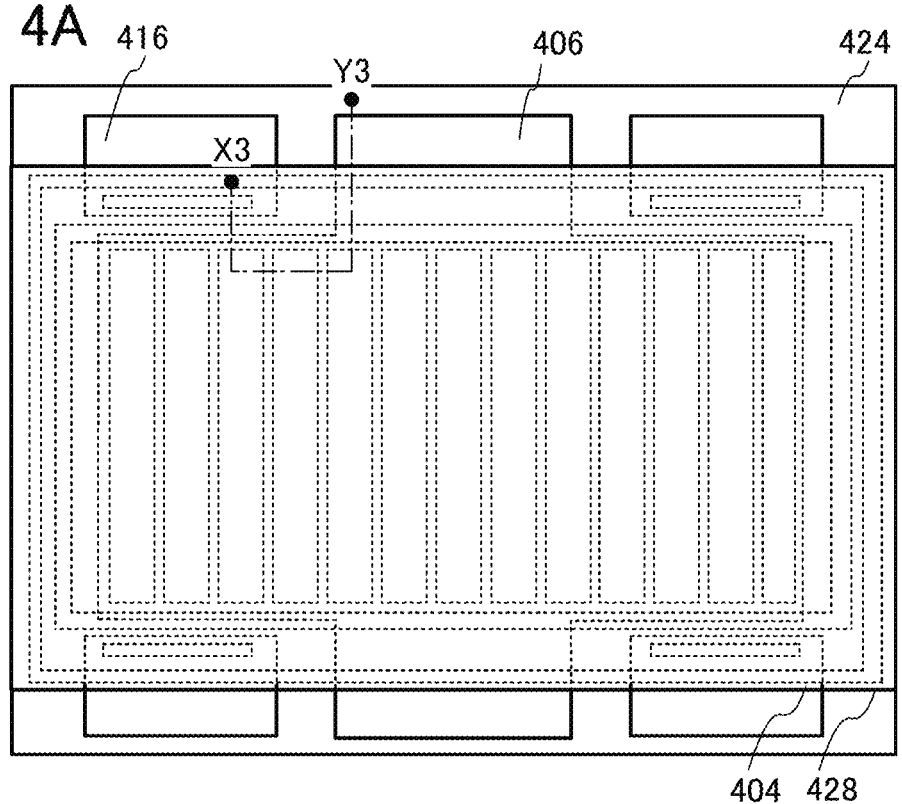
FIGS. 4A and 4B illustrate an example of a light-emitting device.
Figure 4B:
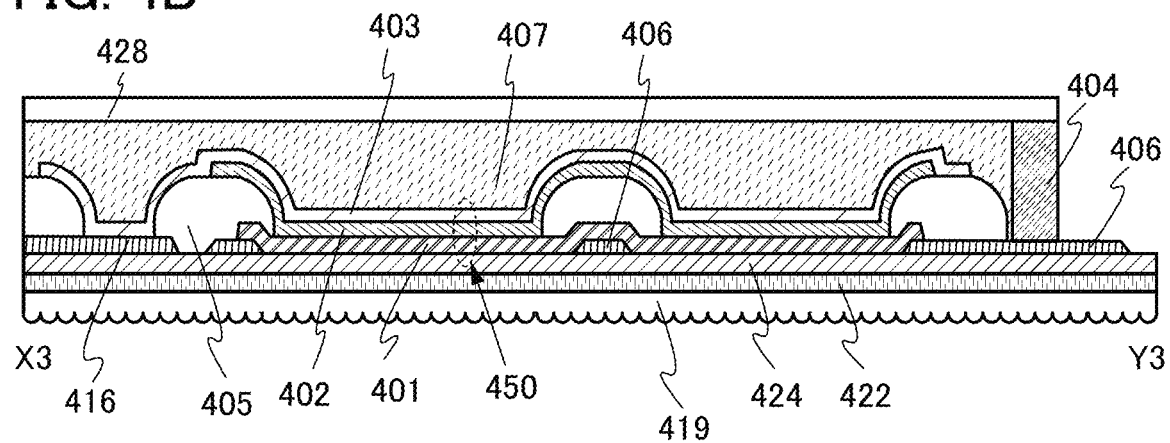

FIG. 4A is a plan view of the light-emitting device, and FIG. 4B is a cross-sectional view taken along dashed-dotted line X3-Y3 in FIG. 4A. The light-emitting device illustrated in FIGS. 4A and 4B is a bottom-emission light-emitting device.

The light-emitting device illustrated in FIG. 4B includes a flexible substrate 419, the adhesive layer 422, the insulating layer 424, a conductive layer 406, a conductive layer 416, the insulating layer 405, the organic EL element 450 (the first electrode 401, the EL layer 402, and the second electrode 403), the second bonding layer 404, the first bonding layer 407, and the flexible substrate 428. The first electrode 401, the insulating layer 424, the adhesive layer 422, and the flexible substrate 419 transmit visible light.

The organic EL element 450 is provided over the flexible substrate 419 with the bonding layer 422 and the insulating layer 424 provided therebetween. The organic EL element 450 is sealed by the flexible substrate 419, the second bonding layer 404, the first bonding layer 407, and the flexible substrate 428. The organic EL element 450 includes the first electrode 401, the EL layer 402 over the first electrode 401, and the second electrode 403 over the EL layer 402. It is preferable that the second electrode 403 reflect visible light.

The end portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 provided therebetween functions as an auxiliary wiring and is electrically connected to the first electrode 401. It is preferable that the auxiliary wiring be electrically connected to the electrode of the organic EL element, in which case a voltage drop due to electrical resistance of the electrode can be inhibited. Note that the conductive layer 406 may be provided over the first electrode 401. Furthermore, an auxiliary wiring which is electrically connected to the second electrode 403 may be provided, for example, over the insulating layer 405.

To increase the light extraction efficiency of the light-emitting device, a light extraction structure is preferably provided on a side from which light emitted from the light-emitting element is extracted. FIG. 4B illustrates an example in which the flexible substrate 419 from which the light emitted from the light-emitting element is extracted also serves as the light extraction structure.

The second bonding layer 404 has a higher gas barrier property than the first bonding layer 407. Thus, moisture and oxygen from the outside can be prevented from entering the light-emitting device. Thus, the light-emitting device can be highly reliable.

In Structural Example 4, it is preferable that the volume of the first bonding layer 407 be less reduced by curing than that of the second bonding layer 404.

Structural Example 5

Figure 5A:
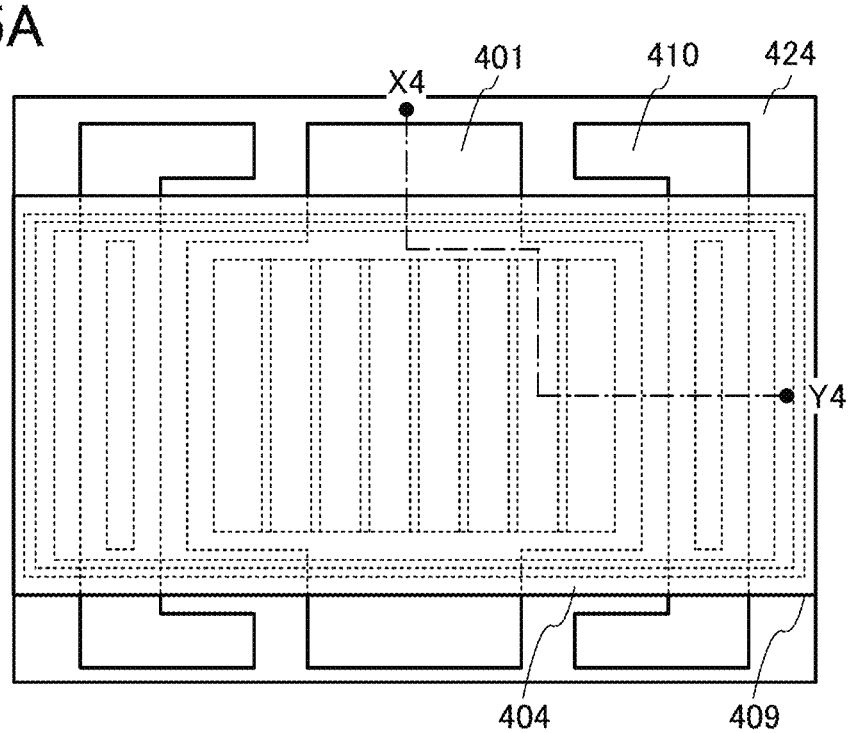
FIGS. 5A and 5B illustrate an example of a light-emitting device.
Figure 5B:
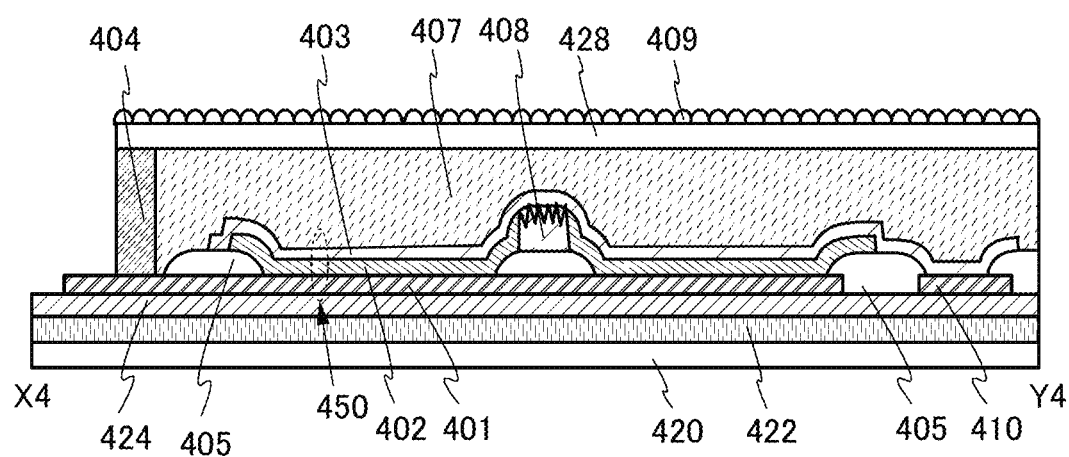

FIG. 5A is a plan view of the light-emitting device, and FIG. 5B is a cross-sectional view taken along dashed-dotted line X4-Y4 in FIG. 5A. The light-emitting device illustrated in FIGS. 5A and 5B is a top-emission light-emitting device.

The light-emitting device illustrated in FIG. 5B includes the flexible substrate 420, the adhesive layer 422, the insulating layer 424, a conductive layer 408, the insulating layer 405, the organic EL element 450 (the first electrode 401, the EL layer 402, and the second electrode 403), a conductive layer 410, the second bonding layer 404, the first bonding layer 407, the flexible substrate 428, and a light extraction structure 409. The second electrode 403, the first bonding layer 407, the flexible substrate 428, and the light extraction structure 409 transmit visible light.

The organic EL element 450 is provided over the flexible substrate 420 with the bonding layer 422 and the insulating layer 424 provided therebetween. The organic EL element 450 is sealed by the flexible substrate 420, the first bonding layer 407, and the flexible substrate 428. The organic EL element 450 includes the first electrode 401, the EL layer 402 over the first electrode 401, and the second electrode 403 over the EL layer 402. It is preferable that the first electrode 401 reflect visible light. The light extraction structure 409 is attached to the surface of the flexible substrate 428.

The end portions of the first electrode 401 and the conductive layer 410 are covered with the insulating layer 405. The conductive layer 410 can be formed using the same process and material as those of the first electrode 401 and is electrically connected to the second electrode 403.

The conductive layer 408 over the insulating layer 405 functions as an auxiliary wiring and is electrically connected to the second electrode 403. Note that the conductive layer 408 may be provided over the second electrode 403. Furthermore, in a manner similar to Structural Example 4, an auxiliary wiring which is electrically connected to the first electrode 401 may be provided.

The second bonding layer 404 has a higher gas barrier property than the first bonding layer 407. Thus, moisture and oxygen can be prevented from entering the light-emitting device through the side surface of the light-emitting device. Thus, the light-emitting device can be highly reliable.

In Structural Example 5, light emission of the organic EL element 450 is extracted from the light-emitting device through the first bonding layer 407. For this reason, the first bonding layer 407 preferably has a higher light-transmitting property than the second bonding layer 404. Furthermore, the first bonding layer 407 preferably has a higher refractive index than the second bonding layer 404. In addition, it is preferable that the volume of the first bonding layer 407 be less reduced by curing than that of the second bonding layer 404.

<Material of Device>

Next, examples of materials that can be used for the light-emitting device are described.

[Flexible Substrate]

A flexible material is used for the flexible substrate. For example, an organic resin, a glass material that is thin enough to have flexibility, or the like can be used. Furthermore, a material which transmits visible light is used for the substrate of the light-emitting device from which light is extracted. A metal substrate or the like may be used in the case where the flexible substrate does not need to transmit visible light.

An organic resin, which has a specific gravity smaller than that of glass, is preferably used for the flexible substrate, in which case the light-emitting device can be more light-weight as compared to the case where glass is used.

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose coefficient of thermal expansion is low is preferable, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

In the case where a fibrous body is contained in the material having flexibility and a light-transmitting property, a high-strength fiber of an organic compound or an inorganic compound is used as the fibrous body. A high-strength fiber is specifically a fiber with a high tensile modulus of elasticity or a fiber with a high Young's modulus. Typical examples of a high-strength fiber include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure in which this fibrous body is impregnated with a resin and the resin is cured may be used as the flexible substrate. The structure including the fibrous body and the resin is preferably used as the flexible substrate, in which case the reliability against bending or breaking due to local pressure can be increased.

To improve the light extraction efficiency, the refractive index of the material having flexibility and a light-transmitting property is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferable, in which case such a filler can maintain optical transparency.

To obtain flexibility and bendability, the thickness of a metal substrate is preferably greater than or equal to 10 μm and less than or equal to 200 μm, further preferably greater than or equal to 20 μm and less than or equal to 50 μm. Since a metal substrate has high thermal conductivity, heat generated by light emission of the light-emitting element can be efficiently released.

Although there is no particular limitation on a material of the metal substrate, it is preferable to use, for example, aluminum, copper, nickel, a metal alloy such as an aluminum alloy or stainless steel.

The flexible substrate may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the functional element (in particular, the organic EL element) due to moisture and the like, an insulating layer having a high gas barrier property described later may be included.

The flexible substrate may be formed by stacking a plurality of layers. When a glass layer is used, a barrier property against water and oxygen can be improved and thus a highly reliable light-emitting device can be provided.

For example, a flexible substrate in which a glass layer, an adhesive layer, and an organic resin layer are stacked from the side closer to an organic EL element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and high flexibility. The thickness of the organic resin layer is greater than or equal to 10 μm and less than or equal to 200 μm, preferably greater than or equal to 20 μm and less than or equal to 50 μm. Providing such an organic resin layer outside the glass layer, occurrence of a crack or a break in the glass layer can be suppressed and mechanical strength can be improved. With the substrate that includes such a composite material of a glass material and an organic resin, a highly reliable flexible light-emitting device can be provided.

Note that one embodiment of the present invention relates to bonding layers for attaching a pair of substrates. One of the characteristics of one embodiment of the present invention is that a first bonding layer is surrounded by a second bonding layer having a higher gas barrier property than the first bonding layer. Thus, not only a flexible substrate but also a rigid glass substrate and tempered glass can be used as the substrate. In that case, an element can be formed on the substrate directly without using an adhesive layer. Even in that case, a highly reliable light-emitting device in which shrinkage of a light-emitting portion is suppressed can be obtained.

[Adhesive Layer, Bonding Layer]

As the adhesive layer or the bonding layer, various curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material having a high gas barrier property, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress entry of impurities such as moisture into the functional element and can improve the reliability of the light-emitting device.

In addition, a filler with a high refractive index or a light scattering member is mixed into the resin, in which case the efficiency of light extraction from the light-emitting element can be improved. For example, titanium oxide, barium oxide, zeolite, or zirconium can be used.

[Insulating Layer]

An insulating layer having a high gas barrier property is preferably used as the insulating layer 424 and the insulating layer 226. In addition, an insulating layer having a high gas barrier property may be formed between the first bonding layer 407 and the second electrode 403.

As an insulating layer having a high gas barrier property, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like can be used.

For example, the permeation amount of gas, oxygen, or water vapor of the insulating layer having a high gas barrier property is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

Note that the above inorganic insulating layers can also be used for other insulating layers.

As the insulating layer 463, for example, an inorganic insulating layer such as a silicon oxide film, a silicon oxynitride film, or an aluminum oxide film can be used. For example, as the insulating layer 465 and the insulating layer 467, an organic material such as polyimide, acrylic, polyamide, polyimide amide, or a benzocyclobutene-based resin can be used. Alternatively, a low-dielectric constant material (a low-k material) or the like can be used. Furthermore, the insulating layer 465 and the insulating layer 467 may be formed by stacking a plurality of insulating layers.

For the insulating layer 405, an organic insulating material or an inorganic insulating material is used. As the resin, for example, a polyimide resin, a polyamide resin, an acrylic resin, a siloxane resin, an epoxy resin, or a phenol resin can be used. It is particularly preferable that the insulating layer 405 be formed to have an inclined side wall with continuous curvature, using a photosensitive resin material.

There is no particular limitation on the method for forming the insulating layer 405; a photolithography method, a sputtering method, an evaporation method, a droplet discharging method (e.g., an ink-jet method), a printing method (e.g., a screen printing method or an off-set printing method), or the like may be used.

[Transistor]

There is no particular limitation on the structure of the transistor used in the light-emitting device of one embodiment of the present invention. For example, a forward staggered transistor or an inverted staggered transistor may be used. Furthermore, a top-gate transistor or a bottom-gate transistor may be used. In addition, there is no particular limitation on a material used for the transistor. For example, a transistor in which silicon, germanium, or an oxide semiconductor is used in a channel formation region can be employed. There is no particular limitation on the crystallinity of a semiconductor, and any of an amorphous semiconductor or a semiconductor having crystallinity (a microcrystalline semiconductor, a polycrystalline semiconductor, and a semiconductor partly including crystal regions) may be used. A semiconductor having crystallinity is preferably used, in which case deterioration of transistor characteristics can be reduced. As silicon, amorphous silicon, single crystal silicon, polycrystalline silicon, or the like can be used. As an oxide semiconductor, an In—Ga—Zn—O-based metal oxide or the like can be used.

For stable characteristics of the transistor, a base film is preferably provided. The base film can be formed with an inorganic insulating layer such as a silicon oxide film, a silicon nitride film, a silicon oxynitride film, or a silicon nitride oxide film to have a single-layer structure or a stacked-layer structure. The base film can be formed by a sputtering method, a plasma CVD method, a coating method, a printing method, or the like. Note that the base film does not need to be provided if not necessary. In each of the above structural examples, the insulating layer 424 can serve as a base film of the transistor.

[Organic EL Element]

There is no particular limitation on the structure of the organic EL element used for the light-emitting device of one embodiment of the present invention. The organic EL element may have a top emission structure, a bottom emission structure, or a dual emission structure.

When a voltage higher than the threshold voltage of the organic EL element is applied between a pair of electrodes, holes are injected to the EL layer 402 from the anode side and electrons are injected to the EL layer 402 from the cathode side. The injected electrons and holes are recombined in the EL layer 402 and a light-emitting substance contained in the EL layer 402 emits light.

A conductive film that transmits visible light is used as the electrode through which light is extracted in the organic EL element. A conductive film that reflects visible light is preferably used as the electrode through which light is not extracted.

The conductive film that transmits visible light can be formed using, for example, indium oxide, an indium tin oxide (ITO), an indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Further alternatively, a stacked film of any of the above materials can be used as the conductive layer. For example, a stacked film of ITO and an alloy of silver and magnesium is preferably used, in which case conductivity can be increased. Still further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on and in contact with an aluminum alloy film, whereby oxidation of the aluminum alloy film can be suppressed. Examples of a material for the metal film or the metal oxide film are titanium and titanium oxide. Alternatively, the above conductive film that transmits visible light and a film containing a metal material may be stacked. For example, a stacked film of silver and ITO or a stacked film of ITO and an alloy of silver and magnesium can be used.

Each of the electrodes can be formed by an evaporation method or a sputtering method. Alternatively, a discharging method such as an ink-jet method, a printing method such as a screen printing method, or a plating method may be used.

The EL layer 402 includes at least a light-emitting layer. In addition to the light-emitting layer, the EL layer 402 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 402, either a low molecular compound or a high molecular compound can be used, and an inorganic compound may also be used. Each of the layers included in the EL layer 402 can be formed by any of the following methods: an evaporation method (including a vacuum evaporation method), a transfer method, a printing method, an ink-jet method, a coating method, and the like.

Although an organic EL element is described here as an example of a light-emitting element, one embodiment of the present invention is not limited thereto and a display element, a light-emitting element, a semiconductor element, or the like may be used. One embodiment of the present invention relates to bonding layers for attaching a pair of substrates, and one of the characteristics of one embodiment of the present invention is that a first bonding layer is surrounded by a second bonding layer having a higher gas barrier property than the first bonding layer. Examples of an element that is sealed by the pair of substrates and the bonding layers include a display element, a light-emitting element, and a semiconductor element.

In this specification and the like, for example, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

[Coloring Layer, Light-Blocking Layer, and Overcoat]

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer is provided between the adjacent coloring layers. The light-blocking layer blocks light emitted from an adjacent organic EL element to prevent color mixture between adjacent organic EL elements. Here, the coloring layer is provided such that its end portion overlaps with the light-blocking layer, whereby light leakage can be reduced. As the light-blocking layer, a material that can block light from the organic EL element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. The overcoat can prevent an impurity and the like contained in the coloring layer from being diffused into the organic EL element. The overcoat is formed with a material that transmits light emitted from the organic EL element; for example, an inorganic insulating layer such as a silicon nitride film or a silicon oxide film, an organic insulating layer such as an acrylic film or a polyimide film can be used, and further, a stacked-layer structure of an organic insulating layer and an inorganic insulating layer may be employed.

In the case where upper surfaces of the coloring layer 432 and the light-blocking layer 431 are coated with a material of the first bonding layer 407, a material which has high wettability with respect to the material of the first bonding layer 407 is preferably used as the material of the overcoat.

For example, an oxide conductive film such as an ITO film or a metal film such as an Ag film which is thin enough to transmit light is preferably used as the overcoat 453 (see FIG. 2C).

[Conductive Layer]

For example, the conductive layer functioning as an electrode or a wiring of the transistor, an auxiliary electrode or an auxiliary wiring of the organic EL element, or the like can be formed to have a single-layer structure or a stacked-layer structure using any of metal materials such as molybdenum, titanium, chromium, tantalum, tungsten, aluminum, copper, neodymium, and scandium, and an alloy material containing any of these elements. The conductive layer may be formed using a conductive metal oxide. As the conductive metal oxide, indium oxide (e.g., $In_2O_3$), tin oxide (e.g., $SnO_2$), zinc oxide (ZnO), ITO, an indium zinc oxide (e.g., $In_2O_3$—ZnO), or any of these metal oxide materials in which silicon oxide is contained can be used.

The thickness of the auxiliary wiring can be greater than or equal to 0.1 μm and less than or equal to 3 μm, preferably greater than or equal to 0.1 μm and less than or equal to 0.5 μm.

When a paste (e.g., silver paste) is used as the material of the auxiliary wiring, a metal forming the auxiliary wiring aggregates in the form of particles. As a result, the surface of the auxiliary wiring becomes rough and has many gaps, so that it is difficult for the EL layer to cover the auxiliary electrode completely. Thus, the upper electrode and the auxiliary wiring are electrically connected to each other easily, which is preferable.

[Light Extraction Structure]

For the light extraction structure, a hemispherical lens, a micro lens array, a film provided with an uneven surface structure, a light diffusing film, or the like can be used. For example, a light extraction structure can be formed by attaching the lens or film to the substrate with an adhesive or the like which has substantially the same refractive index as the substrate, or the lens or film.

[Connector]

For the connector 497, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

<Method 1 for Manufacturing Device>

An example of the top-emission light-emitting device using a color filter method, which is illustrated in FIGS. 2A and 2B (Structural Example 1), will be described below.

Figure 6A:
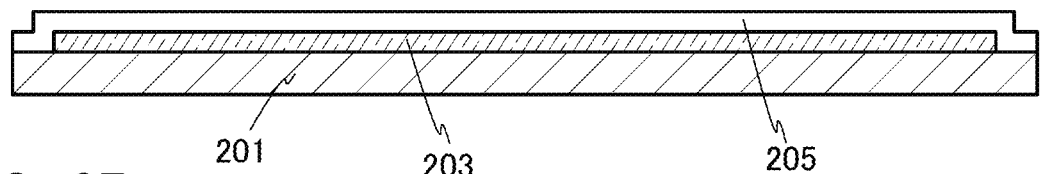
FIGS. 6A to 6D illustrate an example of a method for manufacturing a light-emitting device.

First, as illustrated in FIG. 6A, a separation layer 203 is formed over a formation substrate 201, and a peeled layer 205 is formed over the separation layer 203. Although an example in which the separation layer is formed to have an island shape is described here, one embodiment of the present invention is not limited to such an example. Furthermore, the peeled layer 205 may be formed to have an island shape. In this step, the material of the separation layer 203 can be selected such that peeling occurs at the interface between the formation substrate 201 and the separation layer 203, the interface between the separation layer 203 and the peeled layer 205, or in the separation layer 203 when the peeled layer 205 is peeled from the formation substrate 201. In this embodiment, an example in which peeling occurs at the interface between the peeled layer 205 and the separation layer 203 is described; however, one embodiment of the present invention is not limited to such an example and depends on a material used for the separation layer 203 or the peeled layer 205. Note that in the case where the peeled layer 205 has a stacked-layer structure, a layer in contact with the separation layer 203 is particularly referred to as a first layer.

In the case where the separation layer 203 has a stacked-layer structure of a tungsten film and a tungsten oxide film, for example, part of the separation layer 203 (here, part of the tungsten oxide film) may remain on the peeled layer 205 side when peeling occurs at the interface between the tungsten film and the tungsten oxide film (or the vicinity of the interface). The separation layer 203 remaining on the peeled layer 205 side may be removed after peeling.

As the formation substrate 201, a substrate having at least heat resistance high enough to withstand process temperature in a manufacturing process is used. For example, a glass substrate, a quartz substrate, a sapphire substrate, a semiconductor substrate, a ceramic substrate, a metal substrate, a resin substrate, or a plastic substrate can be used as the formation substrate 201.

Note that it is preferable to use a large-sized glass substrate as the formation substrate 201 in terms of productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

In the case where a glass substrate is used as the formation substrate 201, as a base film, an insulating layer such as a silicon oxide film, a silicon oxynitride film, a silicon nitride film, or a silicon nitride oxide film is preferably formed between the formation substrate 201 and the separation layer 203, in which case contamination from the glass substrate can be prevented.

The separation layer 203 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, an indium tin oxide, an indium zinc oxide, or an In—Ga—Zn oxide can be used. The separation layer 203 is preferably formed using a high-melting point metal material such as tungsten, titanium, or molybdenum, in which case the degree of freedom of the process for forming the peeled layer 205 can be increased.

The separation layer 203 can be formed by, for example, a sputtering method, a plasma CVD method, a coating method (including a spin coating method, a droplet discharging method, a dispensing method, and the like), or a printing method. The thickness of the separation layer 203 is, for example, greater than or equal to 10 nm and less than or equal to 200 nm, preferably greater than or equal to 20 nm and less than or equal to 100 nm.

In the case where the separation layer 203 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the separation layer 203 is formed to have a stacked-layer structure including a layer containing tungsten and a layer containing an oxide of tungsten, the layer containing an oxide of tungsten may be formed as follows: the layer containing tungsten is formed first and an insulating layer formed of an oxide is formed thereover, so that the layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 203 is changed by the plasma treatment or heat treatment, whereby adhesion between the separation layer 203 and an insulating layer formed later can be controlled.

Note that the separation layer is not necessary in the case where peeling at the interface between the formation substrate and the peeled layer is possible. For example, a glass substrate is used as the formation substrate, an organic resin such as polyimide, polyester, polyolefin, polyamide, polycarbonate, or acrylic is formed in contact with the glass substrate, and an insulating film, a transistor, and the like are formed over the organic resin. In this case, locally heating the organic resin by laser irradiation or the like enables peeling at the interface between the formation substrate and the organic resin. Alternatively, peeling at the interface between a metal layer and the organic resin may be performed in the following manner: the metal layer is provided between the formation substrate and the organic resin and current is made to flow in the metal layer so that the metal layer is heated. At this time, the organic resin can be used as a substrate of a light-emitting device. Alternatively, the organic resin may be attached to another substrate with an adhesive.

There is no particular limitation on a layer formed as the peeled layer 205. To manufacture the light-emitting device illustrated in FIG. 2B here, first, the insulating layer 424, the transistor 455, the insulating layer 463, and the insulating layer 465 are formed in this order. Next, an opening is formed in part of the insulating layer 463 and the insulating layer 465, and the first electrode 401 which is electrically connected to the source electrode or the drain electrode of the transistor is formed. Note that the conductive layer 457 is formed using the same material and the same step(s) as those of the source electrode and the drain electrode of the transistor.

The insulating layer 424 preferably has a single-layer structure or a stacked-layer structure including any of a silicon nitride film, a silicon oxynitride film, a silicon oxide film, a silicon nitride oxide film, and the like.

The insulating layer can be formed by a sputtering method, a plasma CVD method, a coating method, a printing method, or the like. For example, the insulating layer is formed at a temperature higher than or equal to 250° C. and lower than or equal to 400° C. by a plasma CVD method, whereby the insulating layer can be a dense film having a very high gas barrier property. Note that the thickness of the insulating layer is preferably greater than or equal to 10 nm and less than or equal to 3000 nm, further preferably greater than or equal to 200 nm and less than or equal to 1500 nm.

Then, the insulating layer 405 covering an end portion of the first electrode 401 is formed. Next, the EL layer 402 is formed over the first electrode 401 and the insulating layer 405, and the second electrode 403 is formed over the EL layer 402. Here, layers from the insulating layer 424 to the second electrode 403 correspond to the peeled layer 205.

Figure 6B:
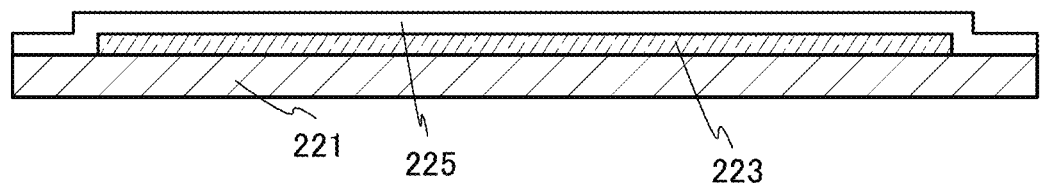

Then, a separation layer 223 and a peeled layer 225 are formed in this order over a formation substrate 221 as illustrated in FIG. 6B. Here, the insulating layer 226 is formed as the peeled layer 225 over the separation layer 223, the light-blocking layer 431 and the coloring layer 432 are formed over the insulating layer 226, and the overcoat 453 is formed over the light-blocking layer 431 and the coloring layer 432.

Figure 6C:
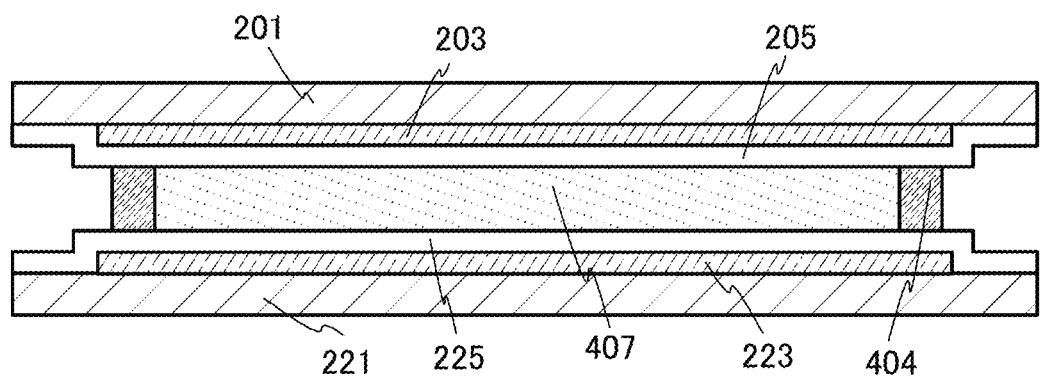

Next, the formation substrate 201 and the formation substrate 221 are attached to each other by using the first bonding layer 407 and the second bonding layer 404 so that the surfaces over which the peeled layers are formed face each other, and then, the first bonding layer 407 and the second bonding layer 404 are cured (FIG. 6C). Here, the second bonding layer 404 in a frame shape and the first bonding layer 407 positioned on an inner side than the second bonding layer 404 in a frame shape are provided over the peeled layer 225 and after that, the formation substrate 201 and the formation substrate 221 face each other and are attached to each other.

A method for curing the first bonding layer 407 and the second bonding layer 404 depends on their materials. For example, the first bonding layer 407 and the second bonding layer 404 may be cured at room temperature or may be cured by heat or light irradiation.

In the case of using a material having low heat resistance for the peeled layer, heating is preferably performed at a temperature that the material can withstand. In this embodiment, the peeled layer includes the organic EL element; thus, in the case where a thermosetting resin is used for the bonding layer, for example, heating is preferably performed at lower than or equal to 80° C.

In contrast, in the case where a photocurable resin is used for the bonding layer, a material that transmit light for curing the photocurable resin is used for the formation substrate 201, the separation layer 203, and the peeled layer 205, or for the formation substrate 221, the separation layer 223, and the peeled layer 225. In that case, each layer has a transmittance of the light greater than 0%, preferably greater than or equal to 1%. The transmittance is preferably as high as possible.

A specific example of a method for curing the first bonding layer 407 and the second bonding layer 404 will be described in Embodiment 2.

Note that the formation substrate 201 and the formation substrate 221 are preferably attached to each other in a reduced-pressure atmosphere.

Figure 23A:
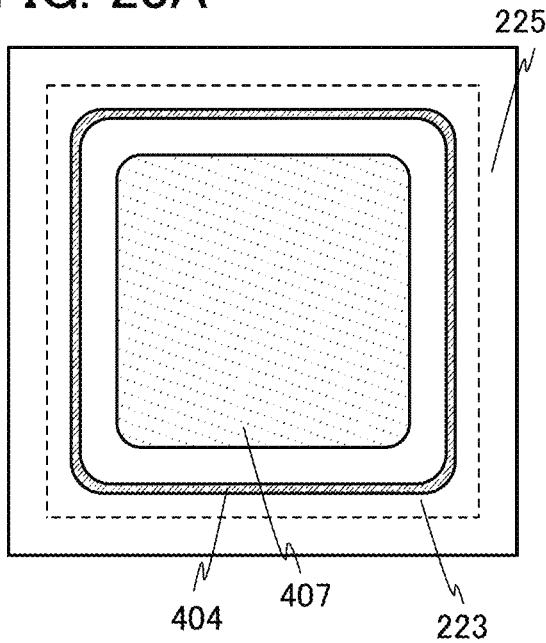
FIGS. 23A to 23D each illustrate an example of a method for manufacturing a light-emitting device.

Here, as illustrated in FIG. 23A, the first bonding layer 407 and the second bonding layer 404 formed over the peeled layer 225 are not necessarily in contact with each other. At the time of attachment of the formation substrate 201 and the formation substrate 221, one or both of the first bonding layer 407 and the second bonding layer 404 are pressed and spread, whereby one or both of the first bonding layer 407 and the second bonding layer 404 may be changed to the state in FIG. 6C or FIG. 11A.

Figure 23B:
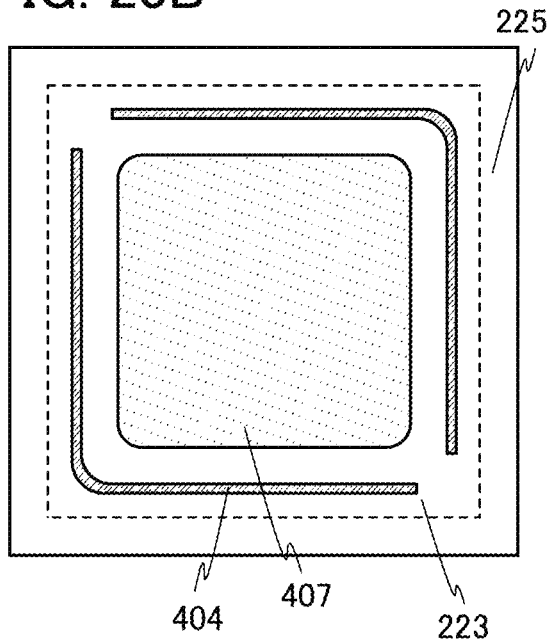
Figure 23C:
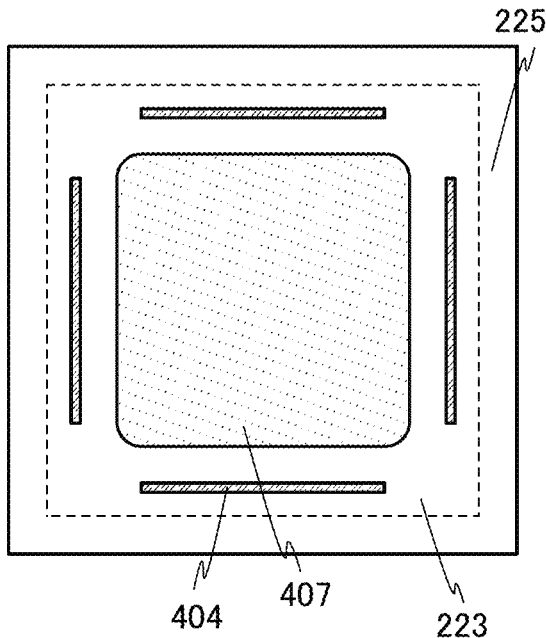
Figure 23D:
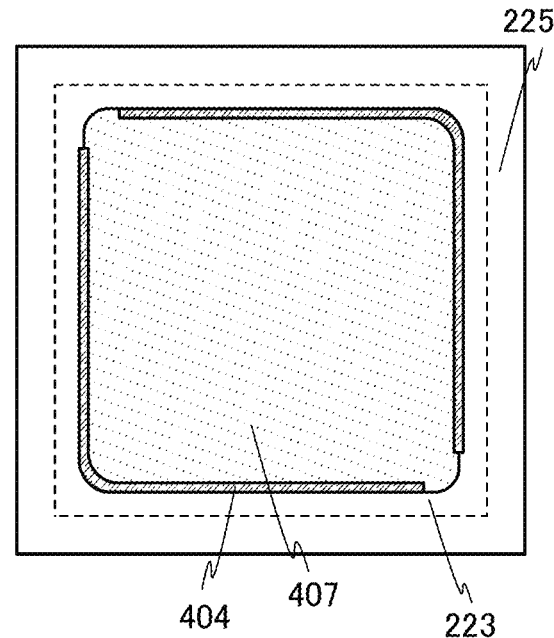

At the time of attachment of the formation substrate 201 and the formation substrate 221, bubbles might be formed between the first bonding layer 407 and the second bonding layer 404. In a portion that has bubbles, the mechanical strength is low and a crack is likely to occur. Thus, as illustrated in FIGS. 23B and 23C, for example, the second bonding layer 404 may be provided except in the vicinity of the corner portion of the substrate so that bubbles are easily removed outside the second bonding layer 404. Note that the shapes of the first bonding layer 407 and the second bonding layer 404 after the attachment of the formation substrate 201 and the formation substrate 221 are not limited to the shapes illustrated in FIG. 11A, and the second bonding layer is not necessarily unified as illustrated in FIG. 23D.

Figure 24A:
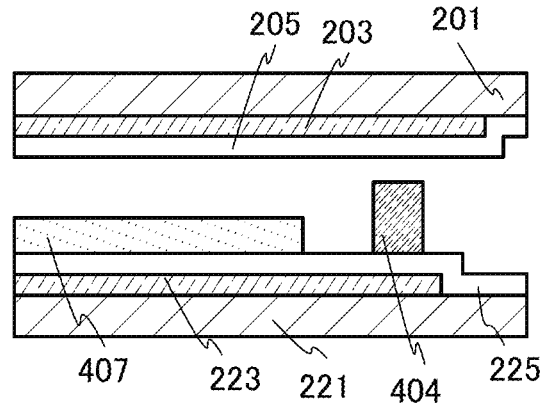
FIGS. 24A to 24D each illustrate an example of a method for manufacturing a light-emitting device.
Figure 24B:
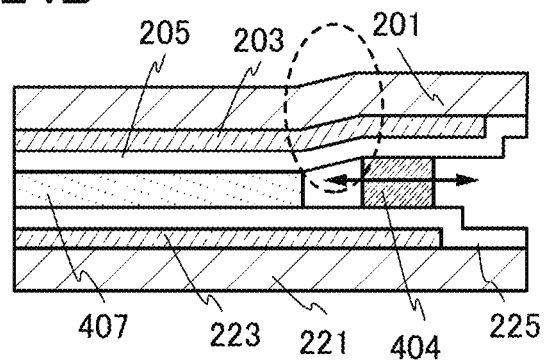

For example, as illustrated in FIG. 24A, the first bonding layer 407 and the second bonding layer 404 are formed over a peeled layer (here, the peeled layer 225), and the formation substrate 201 and the formation substrate 221 are attached to each other in a reduced-pressure atmosphere. Thus, as illustrated in FIG. 24B, the second bonding layer 404 is pressed and spreads in a horizontal direction. When expansion in a horizontal direction is small and the first bonding layer 407 and the second bonding layer 404 are different in thickness (in a vertical direction), a stepped portion might be caused in, for example, a portion surrounded by a dashed line in FIG. 24B.

Figure 24C:
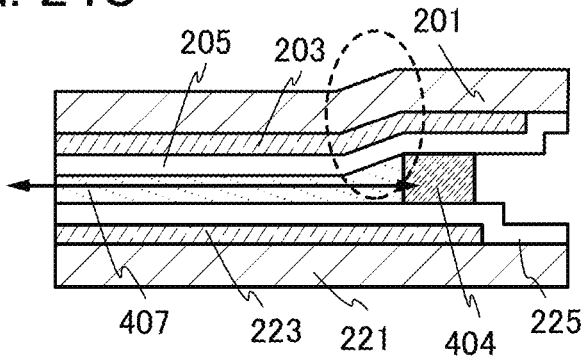

Furthermore, as illustrated in FIG. 24B, when there is a hollow region where the pressure has been reduced between the first bonding layer 407 and the second bonding layer 404, a light-emitting device under manufacture in which the substrates are attached to each other in a reduced-pressure atmosphere are exposed to an atmospheric pressure, so that either or both the first bonding layer 407 and the second bonding layer 404 spread to the hollow region. For example, as illustrated in FIG. 24C, when the first bonding layer 407 spreads to the hollow region and the thickness of the first bonding layer 407 is reduced, a difference in thickness between the first bonding layer 407 and the second bonding layer 404 is further increased, which might cause a large stepped portion.

Figure 24D:
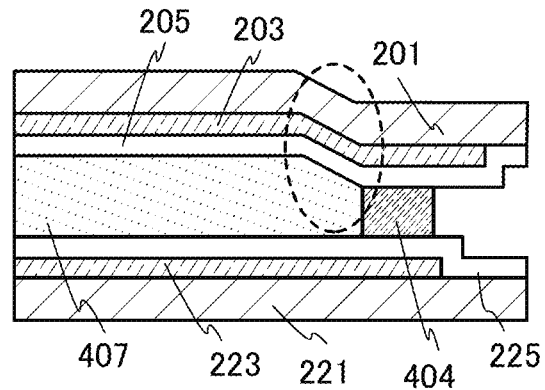

Thus, the light-emitting device of one embodiment of the present invention has a feature that a thickness of the vicinity of an end portion differs from a thickness of a center portion on an inner side than the end portion. For example, the thickness of the vicinity of the end portion of the light-emitting device may be larger as illustrated in FIG. 24C or smaller as illustrated in FIG. 24D than the thickness of the center portion.

In a portion of a light-emitting device during or after manufacture which has a difference in thickness (a stepped portion), a film of layers included in a peeled layer is likely to be peeled, which results in a decrease of the peeling yield and the reliability of the light-emitting device in some cases. Moreover, when a light-emitting region of the light-emitting device has a difference in thickness, display quality might deteriorate with generation of an interference fringe.

Thus, in the light-emitting device of one embodiment of the present invention, it is preferable that a thickness of the vicinity of an end portion of a light-emitting portion be substantially equal to the thickness of the center portion on an inner side than the end portion. At this time, the thickness of the vicinity of the end portion of the light-emitting portion may be different from the thickness of the vicinity of the end portion of the light-emitting device on an outer side than the end portion of the light-emitting portion. Moreover, in the light-emitting device of one embodiment of the present invention, it is preferable that a distance from an interference fringe to the end portion of the light-emitting device be short. For example, the distance may be within 30 mm, 20 mm, or 10 mm. The distance from the interference fringe to the end portion of the light-emitting device is preferably reduced, so that a region that can be used for the light-emitting region of the light-emitting device can be expanded.

Furthermore, in the light-emitting device of one embodiment of the present invention, it is preferable that a thickness of the vicinity of an end portion be substantially equal to the thickness of the center portion on an inner side than the end portion (e.g., a thickness of a center portion of the light-emitting portion or a thickness of the vicinity of the end portion of the light-emitting portion).

Specifically, thicknesses, materials, the application quantities, and the like of the first bonding layer 407 and the second bonding layer 404 are determined as appropriate, whereby a difference in thickness of the device in the vicinity of an interface between the first bonding layer 407 and the second bonding layer 404 can be suppressed.

Figure 6D:
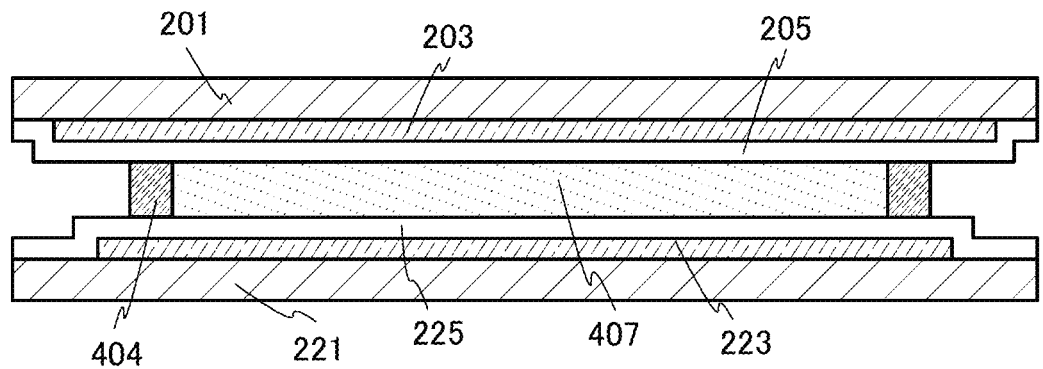

Although FIG. 6C illustrates the case where the separation layer 203 and the separation layer 223 have the same size, the size of the separation layers may be different as illustrated in FIG. 6D.

The first bonding layer 407 and the second bonding layer 404 are provided to overlap with the separation layer 203, the peeled layer 205, the peeled layer 225, and the separation layer 223. Then, an end portion of the second bonding layer 404 is preferably positioned on an inner side than at least an end portion of either the separation layer 203 or the separation layer 223 (the separation layer which is desirably peeled first). Accordingly, strong adhesion between the formation substrate 201 and the formation substrate 221 can be suppressed; thus, a decrease in the yield of a subsequent peeling process can be suppressed.

The fluidity of a material of the second bonding layer 404 before curing is preferably lower than that of a material of the first bonding layer 407 before curing. A portion surrounded by the second bonding layer 404 in a frame shape is filled with the first bonding layer 407, whereby the first bonding layer 407 and the second bonding layer 404 can be prevented from being spread outside the separation layer 203, and a decrease in the yield of the peeling process can be suppressed.

The formation order of the first bonding layer 407 and the second bonding layer 404 is not limited. For example, the first bonding layer 407 can be formed by a screen printing method or the like and then, the second bonding layer 404 can be formed by a coating method or the like. Alternatively, the second bonding layer 404 can be formed by a coating method or the like and then, the first bonding layer 407 can be formed using an apparatus for a one drop fill (ODF) method or the like.

Figure 7A:
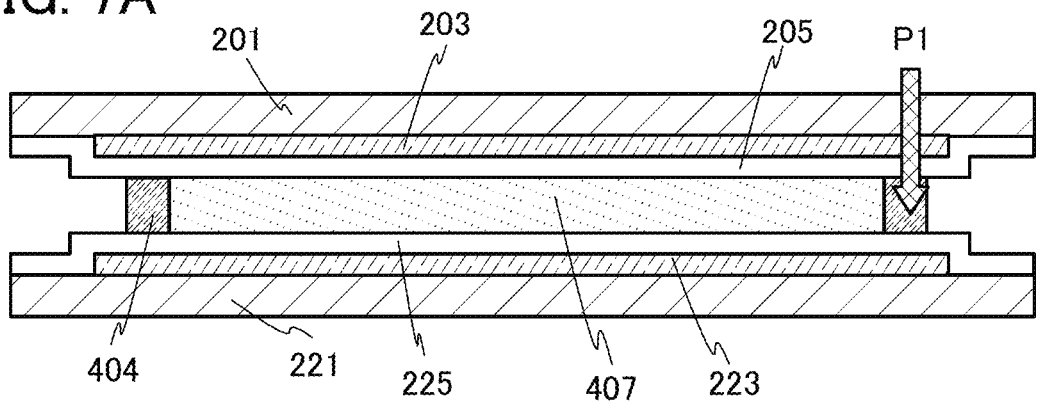
FIGS. 7A to 7D illustrate an example of a method for manufacturing a light-emitting device.
Figure 7B:
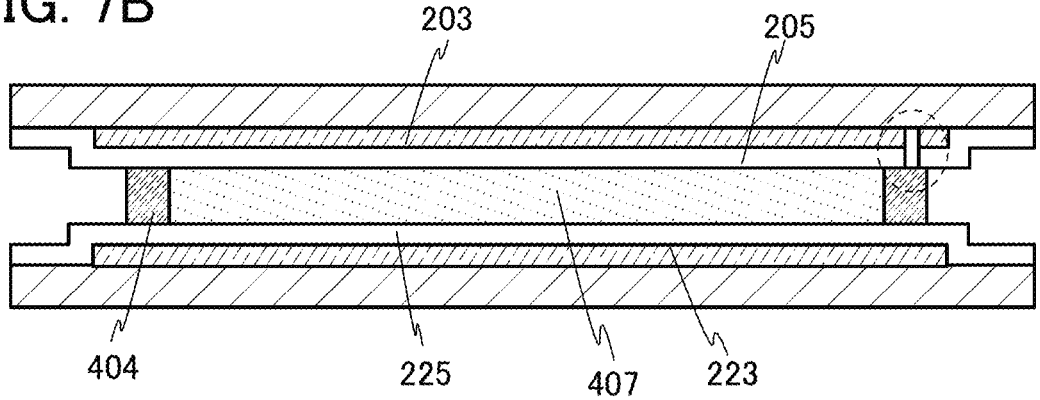

Next, a starting point of peeling is formed by laser irradiation (FIGS. 7A and 7B).

A region where the cured second bonding layer 404, the peeled layer 205, and the separation layer 203 overlap with each other is irradiated with a laser beam (see an arrow P1 in FIG. 7A).

Part of the first layer can be removed and the starting point of peeling (see a region surrounded by a dashed line in FIG. 7B) can be formed by cracking (causing break or crack) at least the first layer (a layer which is included in the peeled layer 205 and which is in contact with the separation layer 203). At this time, not only the first layer but also the separation layer 203, the second bonding layer 404, or another layer included in the peeled layer 205 may be partly removed. Laser irradiation enables part of the films to be dissolved, evaporated, or thermally broken.

Although laser irradiation may be performed from either substrate side, it is preferably performed from the substrate side provided with the separation layer which is desirably peeled. In the case where a region where the separation layer 203 and the separation layer 223 overlap with each other is irradiated with a laser beam, the formation substrate 201 and the separation layer 203 can be selectively peeled by cracking only the peeled layer 205 and not the peeled layer 225. Note that a material that transmits the laser beam is used for the substrate on the side where laser irradiation is performed.

Enlarged views of a region E surrounded by a dashed-dotted line in FIG. 11A are illustrated in FIGS. 11B1 to 11B4. In each enlarged view, a laser irradiation region 215 is illustrated as an example.

It is preferable that at a peeling process, force of separating the peeled layer 205 and the separation layer 203 be concentrated at the starting point of peeling; therefore, it is preferable to form the starting point of peeling not at the center portion of the second bonding layer 404 in a cured state but in the vicinity of the end portion. It is particularly preferable to form the starting point of peeling in the vicinity of the corner portion compared to the vicinity of the side portion among the vicinities of the end portion.

The laser irradiation region 215 may be positioned at a region where the cured second bonding layer 404 and the separation layer 203 overlap with each other as illustrated in FIGS. 11B1 to 11B3, for example. Note that as illustrated in FIG. 11B4, laser irradiation along the side of the second bonding layer 404 is also one mode of laser irradiation performed on the region where the cured second bonding layer 404 and the separation layer 203 overlap with each other.

As illustrated in FIGS. 11B1, 11B3, and 11B4, starting points of peeling preferably form a dashed line by performing laser irradiation discontinuously in the vicinity of the end portion of the second bonding layer 404 because peeling is easily performed.

Starting points of peeling, which form a solid line or a dashed line, may be formed in a frame shape by performing laser irradiation continuously or discontinuously in a region where the second bonding layer 404 in a cured state and the separation layer 203 overlap with each other.

There is no particular limitation on a laser used to form a starting point of peeling. For example, a continuous wave laser or a pulsed oscillation laser can be used. Note that a condition for laser irradiation such as frequency, power density, energy density, or beam profile is controlled as appropriate in consideration of thicknesses, materials, or the like of the formation substrate and the separation layer.

Figure 7C:
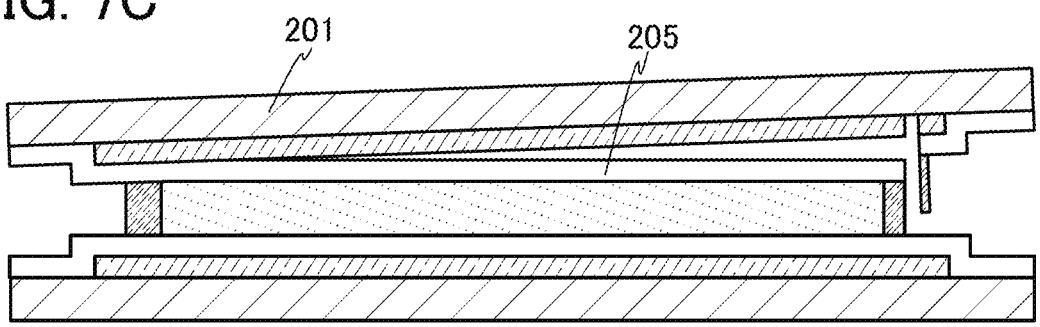
Figure 7D:
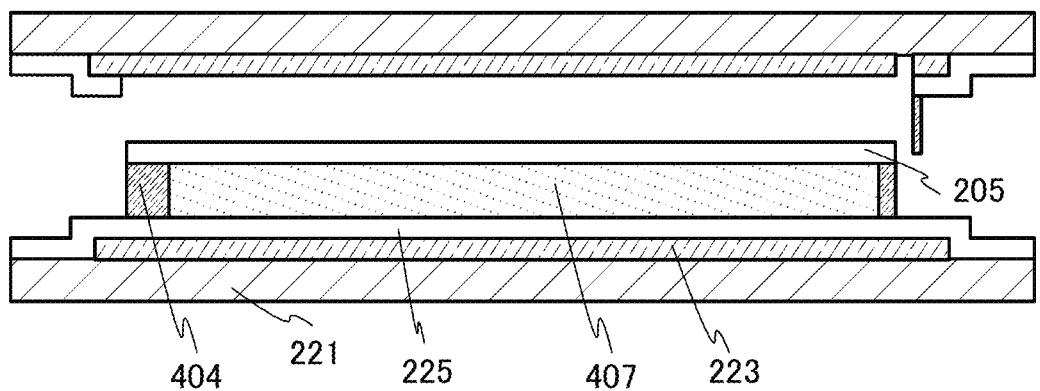

Then, the peeled layer 205 and the formation substrate 201 are separated from each other from the formed starting point of peeling (FIGS. 7C and 7D). Accordingly, the peeled layer 205 can be transferred from the formation substrate 201 to the formation substrate 221.

At this time, one of the substrates is preferably fixed to a suction stage or the like. For example, the formation substrate 201 may be fixed to the suction stage to peel the peeled layer 205 from the formation substrate 201. Alternatively, the formation substrate 221 may be fixed to the suction stage to peel the formation substrate 201 from the formation substrate 221.

For example, the peeled layer 205 and the formation substrate 201 may be separated by mechanical force (a peeling process with a human hand or a gripper, a separation process by rotation of a roller, or the like) from the starting point of peeling.

The formation substrate 201 and the peeled layer 205 may be separated by filling the interface between the separation layer 203 and the peeled layer 205 with a liquid such as water. A portion between the separation layer 203 and the peeled layer 205 absorbs a liquid through capillarity action, so that the separation layer 203 can be separated easily. Furthermore, an adverse effect on the functional element included in the peeled layer 205 due to static electricity caused at peeling (e.g., a phenomenon in which a semiconductor element is damaged by static electricity) can be suppressed.

Figure 8A:
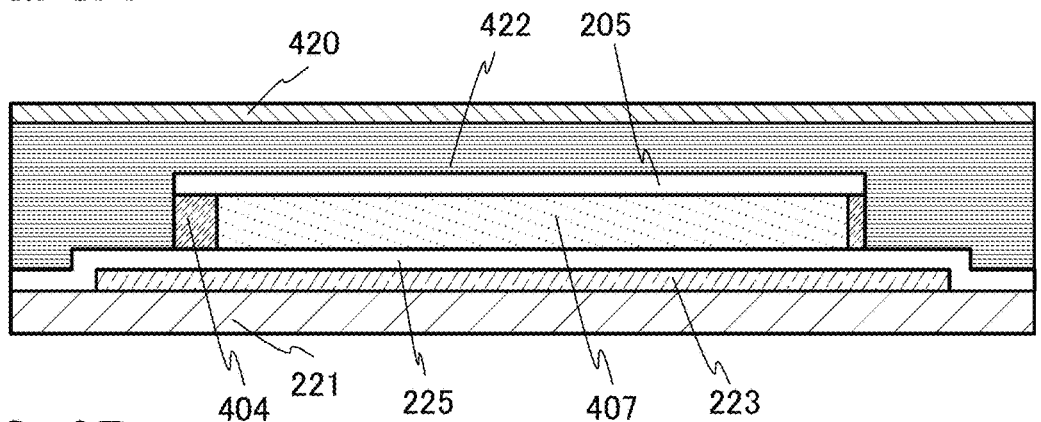
FIGS. 8A to 8D illustrate an example of a method for manufacturing a light-emitting device.

Next, the peeled layer 205 which is peeled from the formation substrate 201 is attached to the flexible substrate 420 by using the adhesive layer 422, and the adhesive layer 422 is cured (FIG. 8A).

Figure 8B:
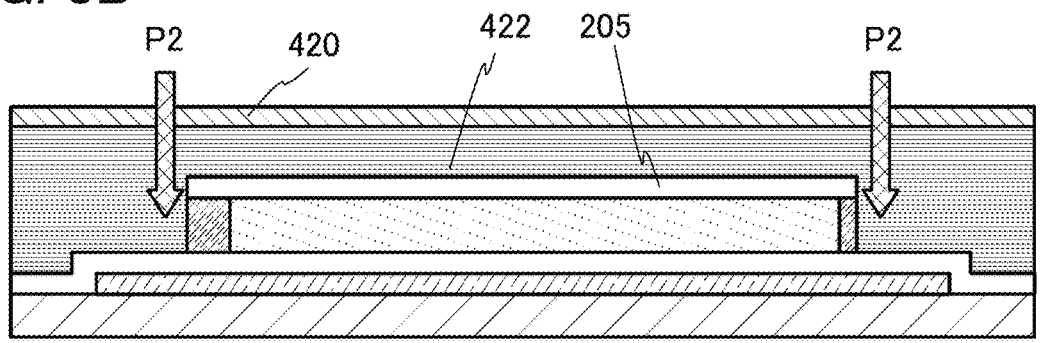
Figure 8C:
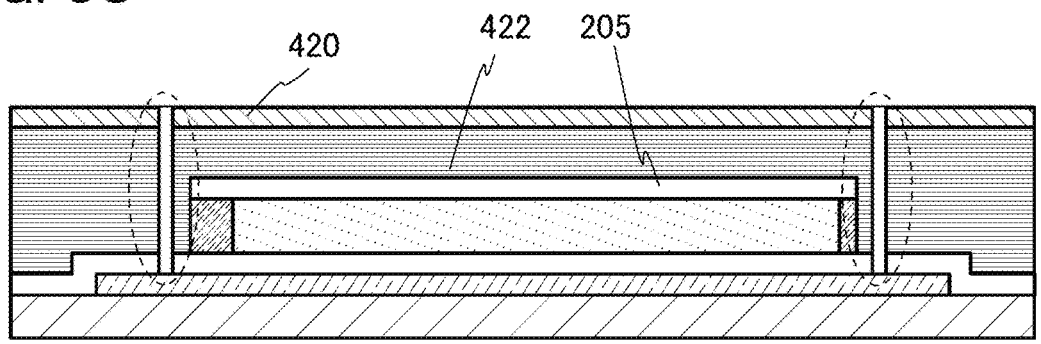

Then, a starting point of peeling is formed by a sharp knife such as a cutter knife (FIGS. 8B and 8C).

In the case where the flexible substrate 420 on the side where the separation layer 223 is not provided can be cut by a knife or the like, a cut may be made in the flexible substrate 420, the adhesive layer 422, and the peeled layer 225 (see arrows P2 in FIG. 8B). Accordingly, part of the first layer can be removed; thus, the starting point of peeling can be formed (see a region surrounded by a dashed line in FIG. 8C).

Here, an example in which the starting point of peeling in a form of a solid line by making a cut in a frame shape in a region where the second bonding layer 404 in a cured state and the separation layer 223 overlap with each other; however, one embodiment of the present invention is not limited to such an example. Note that a cut may be made in the separation layer 223.

As illustrated in FIGS. 8B and 8C, in the case where there is a region in which the formation substrate 221 and the flexible substrate 420 are attached to each other by using the adhesive layer 422 without overlapping with the separation layer 223, the yield of a subsequent peeling process might be decreased depending on a degree of adhesion between the formation substrate 221 and the flexible substrate 420. Therefore, it is preferable to make a cut in a frame shape in a region where the adhesive layer 422 in a cured state and the separation layer 223 overlap with each other to form a starting point of peeling in a form of a solid line. Accordingly, the yield of the peeling process can be improved.

Figure 8D:
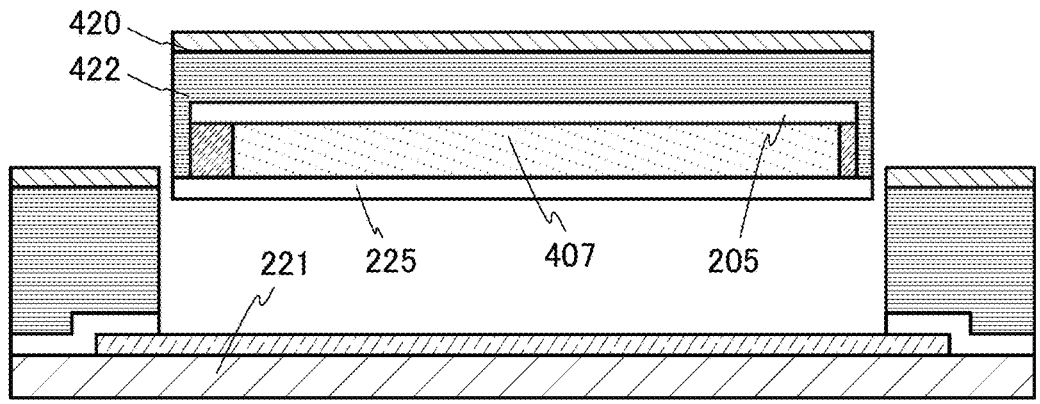

Then, the peeled layer 225 and the formation substrate 221 are separated from each other from the formed starting point of peeling (FIG. 8D). As a result, the peeled layer 225 can be transferred from the formation substrate 221 to the flexible substrate 420.

After that, a step of exposing the conductive layer 457 and a step of attaching the insulating layer 226 and the flexible substrate 428 by using the adhesive layer 426 are performed. Either step may be performed first.

There is no limitation on a method for removing a layer overlapping with the conductive layer 457 to expose the conductive layer 457. For example, the insulating layer 226 or the like may be damaged with a needle or a knife such as a cutter knife, by laser irradiation, or the like, so that a region including part of the insulating layer 226 or the like is removed; the layer overlapping with the conductive layer 457 may be removed from the region part of which is removed. For example, an adhesive roller is pressed to the insulating layer 226 and the roller is rolled and moved relatively. Alternatively, an adhesive tape may be attached to the insulating layer 226 and then peeled.

Note that an opening may be formed in a region of the insulating layer 463 and the insulating layer 465 which overlaps with the conductive layer 457, and an EL layer and a conductive layer may be formed in the opening using the same material and the same step(s) as those of the EL layer 402 and those of the second electrode 403, respectively. Adhesion between the EL layer and the conductive layer and adhesion between layers included in the EL layer are low; thus, separation occurs at an interface between the EL layer and the conductive layer or in the EL layer. Accordingly, a region where the insulating layer 226, the bonding layer, the EL layer, or the conductive layer overlaps with the conductive layer 457 can be removed selectively. Note that in the case where the EL layer or the like remains over the conductive layer 457, it may be removed with an organic solvent or the like.

In the above method for manufacturing the light-emitting device of one embodiment of the present invention, peeling is performed in such a manner that a starting point of peeling is formed by laser irradiation, a sharp knife, or the like and then the interface between separation layer and the peeled layer is made in a peelable state. Accordingly, the yield of the peeling process can be improved.

In this manufacturing method, bonding of the flexible substrates can be performed after the following procedure: a pair of formation substrates each provided with the peeled layer are attached to each other and then, peeling is performed. This means that formation substrates having low flexibility can be used for attaching the peeled layers to each other. Accordingly, alignment accuracy at the time of attachment can be improved as compared to the case where flexible substrates are attached to each other. Thus, it can be said that this manufacturing method has high alignment accuracy at the time of attachment of an organic EL element and a color filter.

Owing to the peeling from a region where the cured second bonding layer 404 and the separation layer overlap with each other, the peeled layer can be double sealed by the first bonding layer 407 and the second bonding layer 404. As a result, a highly reliable light-emitting device in which deterioration of an organic EL element due to moisture and oxygen is prevented can be manufactured.

Although the end portion of the second bonding layer 404 is covered by the adhesive layer 422 in FIG. 8D, the light-emitting device of one embodiment of the present invention is not limited thereto. In the case where the adhesive layer 422 has a high gas barrier property, the end portion of the second bonding layer 404 is preferably covered by the adhesive layer 422 because the entry of impurities into the light-emitting device can be prevented. Alternatively, the end portion of the light-emitting device may be cut, so that the second bonding layer 404 is not covered at the side surface of the light-emitting device; accordingly, the light-emitting device can have a narrow non-light-emitting region (i.e., narrow bezel). Since the second bonding layer 404 is formed using a layer having a high gas barrier property in one embodiment of the present invention, a decrease in the reliability of the light-emitting device can be suppressed even when the second bonding layer 404 is not covered at the side surface of the light-emitting device.

<Method 2 for Manufacturing Device>

In Method 2 for Manufacturing Device, steps up to the first peeling process are similar to those in Method 1 for Manufacturing Device. Steps after a step in FIG. 7D will be described below in detail.

Figure 9A:
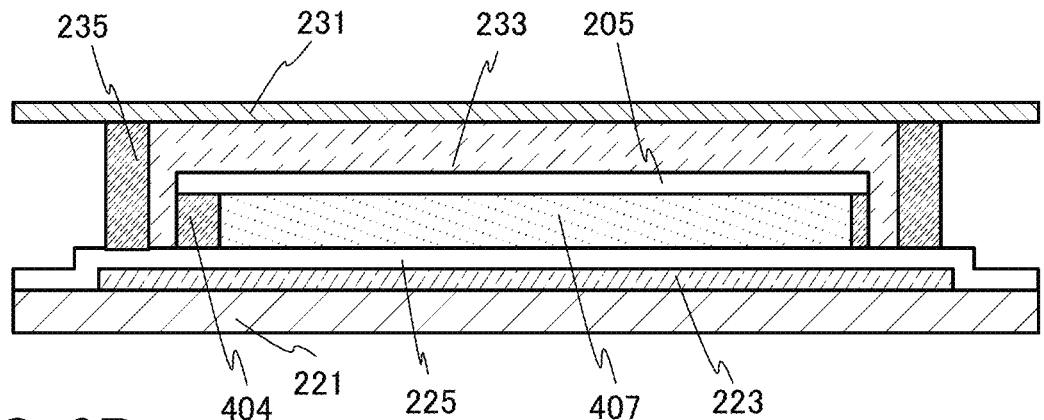
FIGS. 9A to 9D illustrate an example of a method for manufacturing a light-emitting device.

The peeled layer 205 separated from the formation substrate 201 is attached to a flexible substrate 231 by using a third bonding layer 233 and a fourth bonding layer 235, and then, the third bonding layer 233 and the fourth bonding layer 235 are cured (FIG. 9A). Here, the fourth bonding layer 235 in a frame shape and the third bonding layer 233 surrounded by the fourth bonding layer 235 are provided over the peeled layer 225 and then, the peeled layer 225 and the flexible substrate 231 are attached to each other.

Note that the peeled layer 205 and the flexible substrate 231 are preferably attached to each other in a reduced-pressure atmosphere.

Figure 9B:
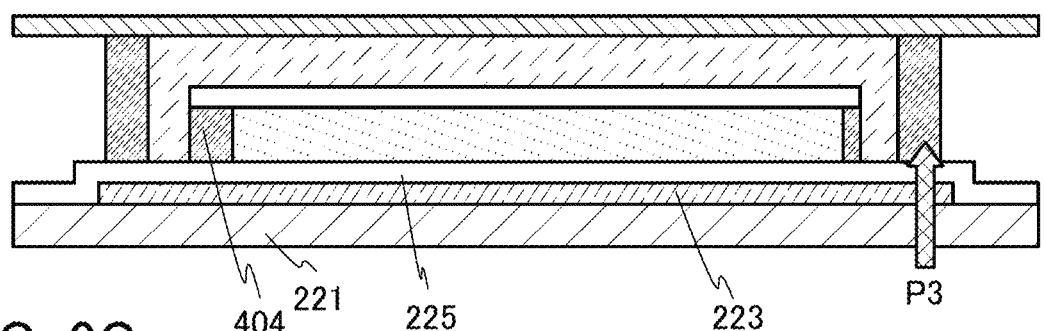
Figure 9C:
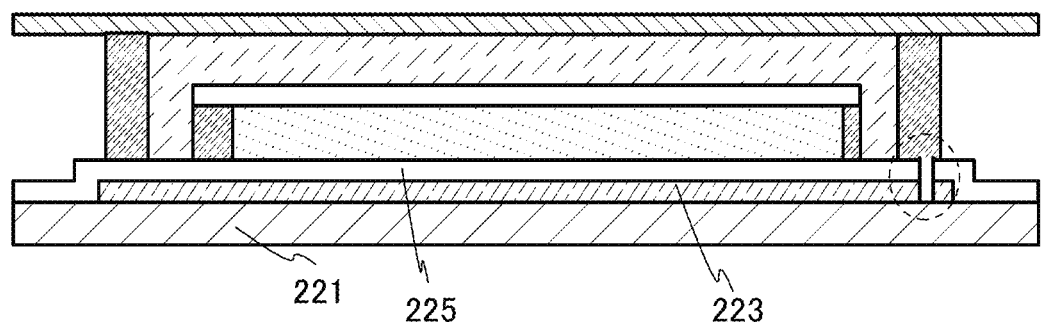

Next, a starting point of peeling is formed by laser irradiation (FIGS. 9B and 9C).

Here, the cured fourth bonding layer 235 is irradiated with a laser beam (see an arrow P3 in FIG. 9B). Part of the first layer is removed; thus, the starting point of peeling can be formed (see a region surrounded by a dashed line in FIG. 9C). At this time, not only the first layer but also the separation layer 223, the fourth bonding layer 235, or a layer other than the layer 225 may be partly removed.

It is preferable that laser irradiation be performed from the formation substrate 221 side in which the separation layer 223 is provided.

Figure 9D:
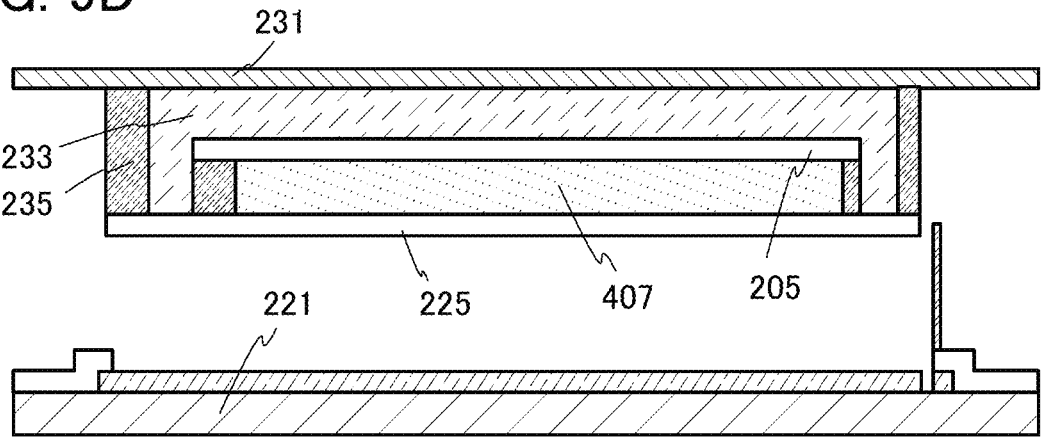

Then, the peeled layer 225 and the formation substrate 221 are separated from each other from the formed starting point of peeling (FIG. 9D). As a result, the peeled layer 205 and the peeled layer 225 can be transferred to the flexible substrate 231.

After that, a step of exposing the conductive layer 457 and a step of attaching the insulating layer 226 and the flexible substrate 428 by using the adhesive layer 426 are performed. Either step may be performed first.

In the above method for manufacturing the light-emitting device of one embodiment of the present invention, peeling is performed in such a manner that a starting point of peeling is formed by laser irradiation after a pair of formation substrates each provided with a separation layer and a peeled layer are attached to each other and then the separation layers and peeled layers are made in a peelable state. Accordingly, the yield of the peeling process can be improved.

In addition, bonding of a substrate over which a device is formed can be performed after the following procedure: a pair of formation substrates each provided with the peeled layer are attached to each other and then, peeling is performed. This means that formation substrates having low flexibility can be used for attaching the peeled layers to each other. Accordingly, alignment accuracy at the time of attachment can be improved as compared to the case where flexible substrates are attached to each other.

Owing to the peeling from a region where the cured second bonding layer 404 and the separation layer overlap with each other, the peeled layer can be double sealed by the first bonding layer 407 and the second bonding layer 404. As a result, a highly reliable light-emitting device in which deterioration of an organic EL element due to moisture and oxygen is prevented can be manufactured.

In the structure illustrated in FIG. 9D, the organic EL element 450 is sealed by the first bonding layer 407, the second bonding layer 404, the third bonding layer 233, and the fourth bonding layer 235; thus, the entry of impurities into the light-emitting device can be prevented. Note that the structure of the light-emitting device of one embodiment of the present invention is not limited thereto. The end portion of the light-emitting device may be cut to remove at least part of the third bonding layer 233 and the fourth bonding layer 235, so that the second bonding layer 404 is not covered at the side surface of the light-emitting device; accordingly, the light-emitting device can have a narrow non-light-emitting region (narrow bezel). Since the second bonding layer 404 is formed using a layer having a high gas barrier property in one embodiment of the present invention, a decrease in the reliability of the light-emitting device can be suppressed even when the second bonding layer 404 is not covered at the side surface of the light-emitting device.

<Method 3 for Manufacturing Device>

An example of the top-emission light-emitting device using a separate coloring method, which is illustrated in FIGS. 3A and 3B (Structural Example 2), will be described below.

Note that the light-emitting devices in Structural Examples 3 to 5 can be manufactured in a similar manner by changing the structure of the peeled layer.

Figure 10A:
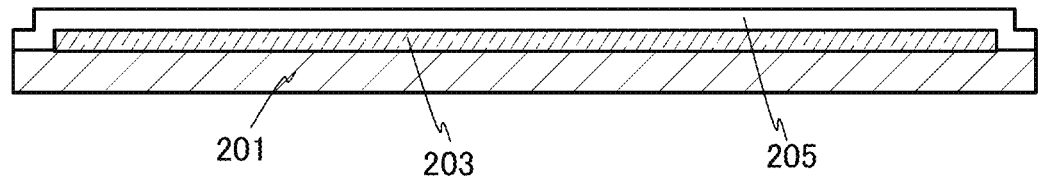
FIGS. 10A to 10D illustrate an example of a method for manufacturing a light-emitting device.

First, as illustrated in FIG. 10A, the separation layer 203 is formed over the formation substrate 201, and the peeled layer 205 is formed over the separation layer 203. A layer similar to that described in Method 1 for Manufacturing Device is formed as the peeled layer 205. Note that since a separate coloring method is used here, at least part of the EL layer 402 included in the organic EL element 450 is separated between pixels.

Figure 10B:
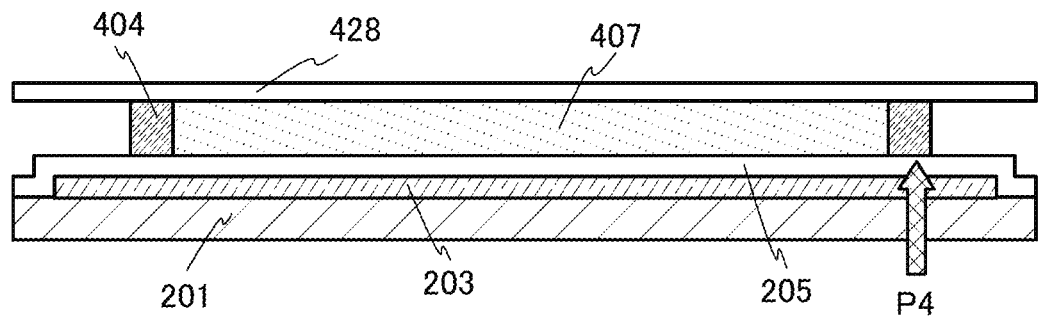

Next, the formation substrate 201 and the flexible substrate 428 are attached to each other by using the first bonding layer 407 and the second bonding layer 404 and then, the first bonding layer 407 and the second bonding layer 404 are cured (FIG. 10B). Here, the second bonding layer 404 in a frame shape and the first bonding layer 407 positioned on an inner side than the second bonding layer 404 in a frame shape are provided over the flexible substrate 428 and after that, the formation substrate 201 and the flexible substrate 428 face each other and are attached to each other.

Note that the formation substrate 201 and the flexible substrate 428 are preferably attached to each other in a reduced-pressure atmosphere.

Here, the first bonding layer 407 and the second bonding layer 404 are provided so as to overlap with the separation layer 203 and the peeled layer 205. As illustrated in FIG. 10B, it is preferable that an end portion of the second bonding layer 404 not be positioned on an outer side than an end portion of the separation layer 203. When there is a region where the second bonding layer 404 does not overlap with the separation layer 203, failure of peeling is likely to occur depending on the area of the region and the degree of adhesion between the second bonding layer 404 and a layer in contact therewith. Thus, it is preferable that the second bonding layer 404 be positioned on an inner side than the separation layer 203 or the end portion of the second bonding layer 404 and the end portion of the separation layer 203 be aligned with each other.

As illustrated in FIG. 11C, a resin layer 213 may be provided outside the first bonding layer 407 and the second bonding layer 404. FIG. 11C illustrates a plan view from the flexible substrate 428 side and a cross-sectional view taken along dashed-dotted line A1-A2 in the plan view (the flexible substrate 428 is not illustrated in the plan view). With the resin layer 213, entry of impurities such as moisture into the peeled layer 205 can be prevented even when the device is exposed to the air atmosphere during the manufacturing process.

Moreover, when the resin layer 213 is in a cured state, the yield of a subsequent peeling process might be decreased because of the degree of adhesion between the formation substrate 201 and the flexible substrate 428. Thus, at least part of the resin layer 213 is preferably in a semi-cured state or an uncured state. With the use of a material having high viscosity for the resin layer 213, an effect of preventing entry of impurities such as moisture in the air into the peeled layer 205 can be increased even when the resin layer 213 is in a semi-cured state or an uncured state.

For example, a light curable resin is used for the resin layer 213 and is partly irradiated with light, so that part of the resin layer 213 is cured. It is preferable to partly cure the resin layer 213 because the gap between the formation substrate 201 and the flexible substrate 428 and the positions of the substrates can remain unchanged even when the device is moved from a reduced-pressure atmosphere to the air atmosphere during the process. Note that the resin layer 213 is preferably formed also in Method 1 for Manufacturing Device and Method 2 for Manufacturing Device.

Figure 10C:
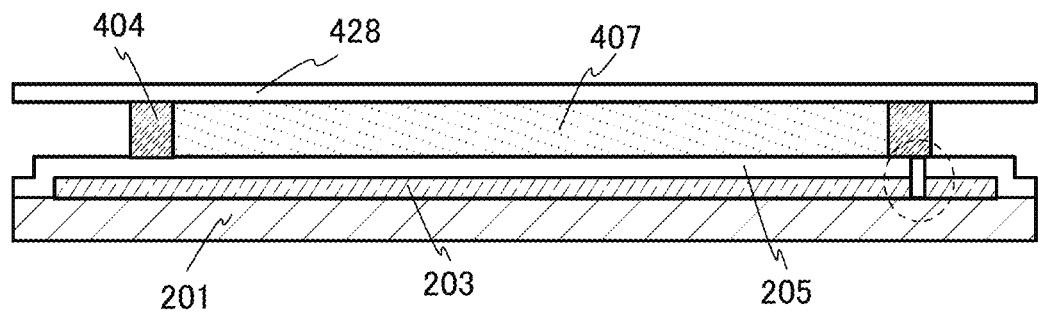

Next, a starting point of peeling is formed by laser irradiation (FIGS. 10B and 10C).

A region where the cured second bonding layer 404, the peeled layer 205, and the separation layer 203 overlap with each other is irradiated with a laser beam (see an arrow P4 in FIG. 10B).

Part of the first layer is removed, so that the starting point of peeling (see a region surrounded by a dashed line in FIG. 10C) can be formed. At this time, not only the first layer but also the separation layer 203, the second bonding layer 404, or another layer included in the peeled layer 205 may be partly removed.

Although laser irradiation may be performed from either substrate side, it is preferable to perform laser irradiation from the formation substrate 201 side in which the separation layer 203 is provided so that irradiation of the organic EL element or the like with scattered light can be suppressed.

Figure 10D:
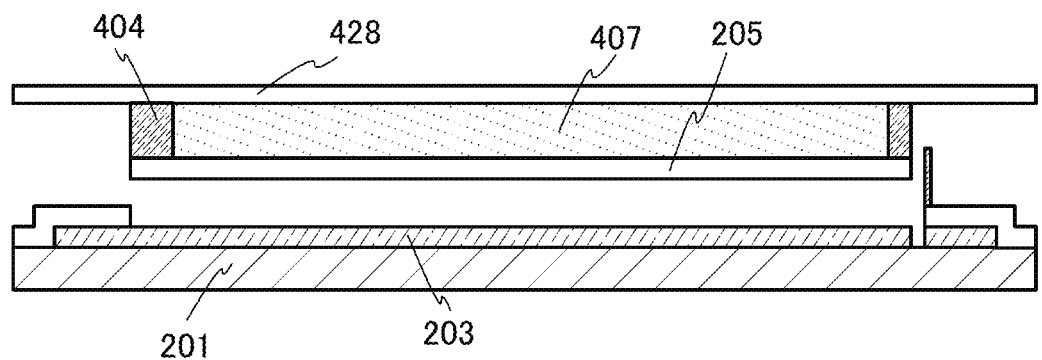

Then, the peeled layer 205 and the formation substrate 201 are separated from each other from the formed starting point of peeling (FIG. 10D). As a result, the peeled layer 205 can be transferred from the formation substrate 201 to the flexible substrate 428.

In the above method for manufacturing the light-emitting device of one embodiment of the present invention, peeling is performed in such a manner that a starting point of peeling is formed by laser irradiation, and then the interface between the separation layer 203 and the peeled layer 205 is made in a peelable state. Accordingly, the yield of the peeling process can be improved.

The starting point of peeling is formed by laser irradiation in the above description. However, in the case where the flexible substrate 428 can be cut with a sharp knife such as a cutter knife, a cut may be made in the flexible substrate 428, the second bonding layer 404, and the peeled layer 205, whereby part of the first layer can be removed to form a starting point of peeling.

After that, a step of exposing the conductive layer 457 and a step of attaching the peeled layer 205 and the flexible substrate 420 by using the adhesive layer 422 are performed. Either step may be performed first.

Owing to the peeling from a region where the cured second bonding layer 404 and the separation layer 203 overlap with each other, the peeled layer 205 can be double sealed by the first bonding layer 407 and the second bonding layer 404. As a result, a highly reliable light-emitting device in which deterioration of an organic EL element due to moisture and oxygen is prevented can be manufactured.

Figure 12A:
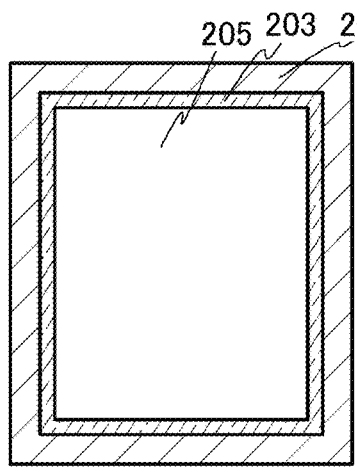
FIGS. 12A to 12F each illustrate a planar shape of a separation layer.
Figure 12B:
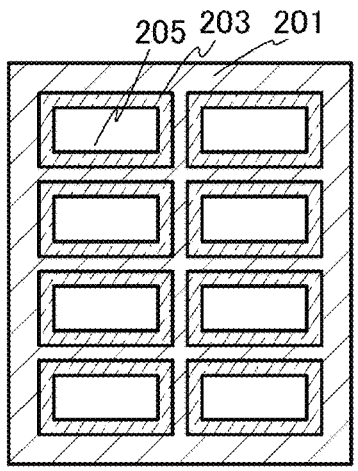
Figure 12C:
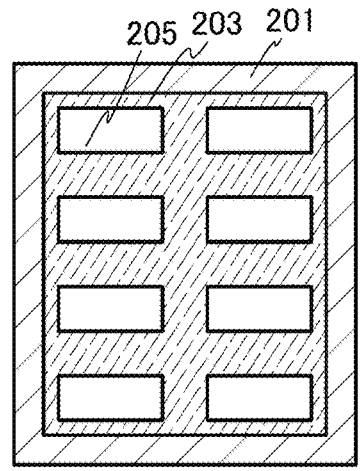

As described above, an end portion of a region that can be peeled and transferred is on an inner side than the end portion of the separation layer 203. As illustrated in FIGS. 12A to 12C, an end portion of the peeled layer 205 is positioned on an inner side than the end portion of the separation layer 203. In the case where there are a plurality of peeled layers 205, the separation layer 203 may be provided in each peeled layer 205 as illustrated in FIG. 12B or a plurality of peeled layers 205 may be provided over one separation layer 203 as illustrated in FIG. 12C.

An example where a flexible sample was fabricated by peeling and transferring will be described with reference to FIGS. 20A to 20D. In the example described here, a peeled layer was transferred from a glass substrate to an organic resin film substrate.

Figure 20C:
FIGS. 20A to 20D are photographs for showing fabrication of flexible samples using a peeling and transferring process.
Figure 20B:
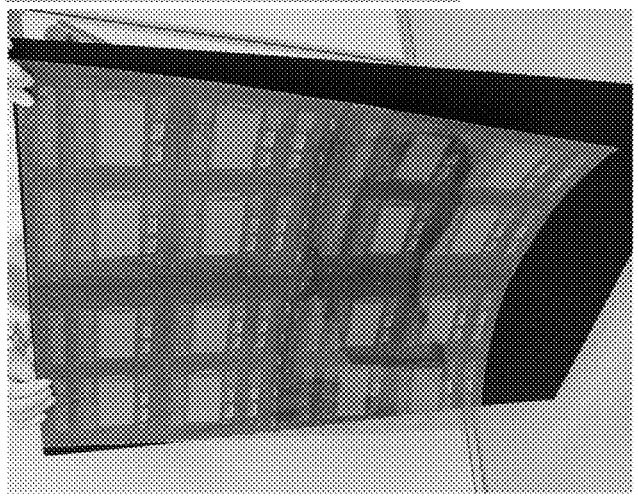
Figure 20A:
Figure 20D:
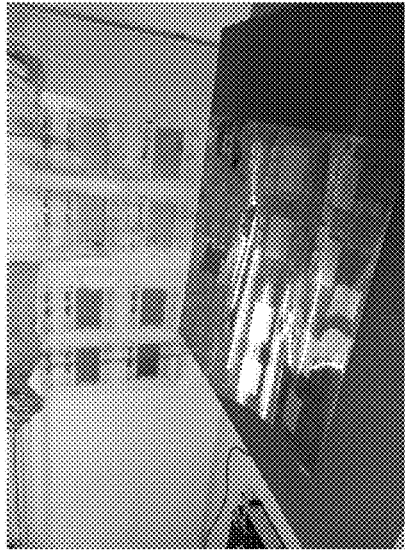

In a method for fabricating the sample, first, an island-shaped tungsten film (579 mm×696 mm) was formed as a separation layer over a glass substrate with a size of 600 mm×720 mm. Then, a peeled layer was formed over the separation layer. The peeled layer includes an inorganic insulating film over the tungsten film, a plurality of transistors over the inorganic insulating film, an adhesive layer over the plurality of transistors, and an organic resin film substrate over the adhesive layer. FIG. 20A shows the plurality of transistors formed over the glass substrate.

After that, the glass substrate and the peeled layer were separated by the separation layer. The peeled layer peeled from the glass substrate is flexible as shown in FIG. 20B. Subsequently, another organic resin film substrate was attached to the exposed inorganic insulating film by using the adhesive layer. In this manner, the flexible sample shown in FIGS. 20C and 20D was fabricated in which the peeled layer is sandwiched between the pair of organic resin film substrates. Note that the organic resin film substrates in FIGS. 20C and 20D contain different materials. The substrate shown in FIG. 20D contains a film (specifically, a PEN film) having a higher visible light transmitting property than the substrate shown in FIG. 20C.

An organic EL element, a first bonding layer, and a second bonding layer are formed as a peeled layer by using one embodiment of the present invention, whereby a light-emitting device as large as or larger than the above sample (600 mm×720 mm) can be manufactured.

As described above, the light-emitting device of one embodiment of the present invention includes the first bonding layer and the second bonding layer between the flexible substrate and the organic EL element. The first bonding layer is surrounded by the second bonding layer having a higher gas barrier property than the first bonding layer. Thus, even when a material having a low gas barrier property and having a small reduction in volume due to curing, a high light-transmitting property (visible light transmittance, in particular), or a high refractive index is used for the first bonding layer, for example, moisture and oxygen can be prevented from entering the light-emitting device from the outside. Accordingly, a highly reliable light-emitting device in which shrinkage of a light-emitting portion is suppressed can be obtained.

This embodiment can be implemented in appropriate combination with any of the other embodiments.

Embodiment 2

An example of a method for curing the bonding layer in manufacture of the light-emitting device of one embodiment of the present invention will be described in this embodiment.

In this embodiment, the first bonding layer 407 and the second bonding layer 404 in the light-emitting device illustrated in FIGS. 2A and 2B are cured. As illustrated in FIG. 6C, the first bonding layer 407 and the second bonding layer 404 overlap with the formation substrate 201, the separation layer 203, and the peeled layer 205 on one side, and overlap with the formation substrate 221, the separation layer 223, and the peeled layer 225 on the other side.

Since an end portion of a region that can be peeled and transferred is on an inner side than an end portion of the separation layer, the first bonding layer 407 and the second bonding layer 404 should overlap with the separation layer to manufacture the light-emitting device including the first bonding layer 407 and the second bonding layer 404. In addition, the first bonding layer 407 and the second bonding layer 404 are necessarily cured through the separation layer.

Two examples of a process for curing the bonding layers are described below. In the first example, a photocurable resin is used for the first bonding layer 407 and the second bonding layer 404. In the second example, a thermosetting resin is used for the second bonding layer 404.

<Curing Method 1 of Bonding Layer>

In the case where a photocurable resin is used as a material of the bonding layer, light for curing the photocurable resin needs to be transmitted through the formation substrate, the separation layer, and the peeled layer.

In the method for manufacturing the light-emitting device of one embodiment of the present invention, a stack including a tungsten film and a tungsten oxide film is used as the separation layer and peeling is performed at the interface (or in the vicinity of the interface) between the tungsten film and the tungsten oxide film, whereby the formation substrate and the peeled layer can be separated.

Note that depending on the material, the separation layer with too large thickness has a low the light-transmitting property as in the case of using a metal film such as a tungsten film; thus, light for curing a photocurable resin hardly passes through the separation layer. This causes a problem in that, for example, a photocurable resin is not cured or it takes long time to cure a photocurable resin.

For this reason, in the separation layer, the transmittance of light for curing a photocurable resin is preferably greater than 0%, further preferably greater than or equal to 1%.

In contrast, when the separation layer is too thin, the yield of the peeling process might decline. In addition, it is difficult to form a thin separation layer with a uniform thickness in some cases.

Accordingly, the thickness of the separation layer is preferably greater than or equal to 2 nm, further preferably greater than or equal to 5 nm.

Figure 16:
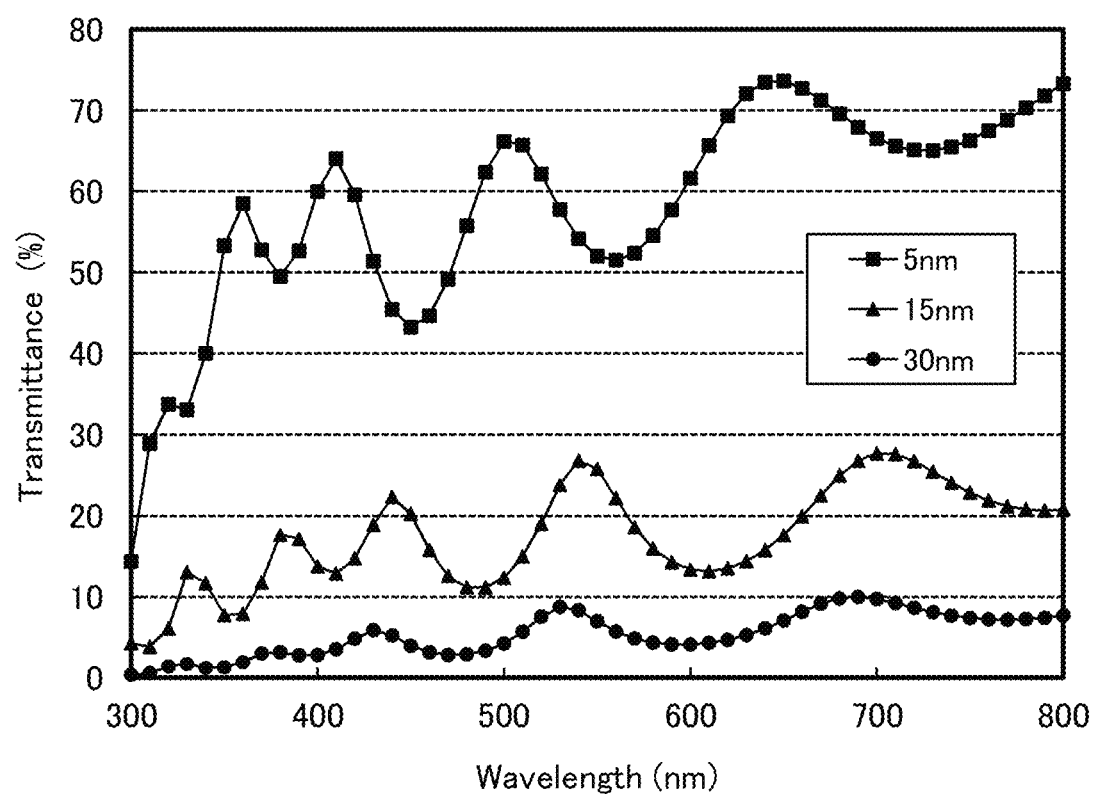
FIG. 16 is a graph showing transmittance of samples.

FIG. 16 shows, for example, the transmittance of samples in each of which a glass substrate, a tungsten film, and a stack including a 600-nm-thick silicon oxynitride film and a 200-nm-thick silicon nitride film are used as the formation substrate 201, the separation layer 203, and the peeled layer 205 illustrated in FIG. 6A, respectively.

FIG. 16 shows the results of the samples including tungsten films with thicknesses of 5 nm, 15 nm, and 30 nm.

The transmittance of ultraviolet light of the tungsten film is approximately 2% to 3% even when the thickness is 30 nm, which indicates that an ultraviolet photocurable resin can be cured through the sample. Furthermore, the thinner the tungsten film is, the higher the transmittance is, which suggests that an ultraviolet photocurable resin can be surely cured or cured in a short time through the sample.

Figure 12D:
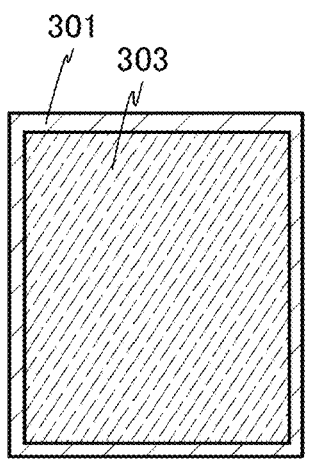
Figure 12E:
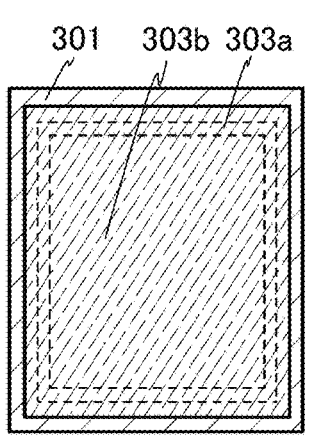
Figure 12F:
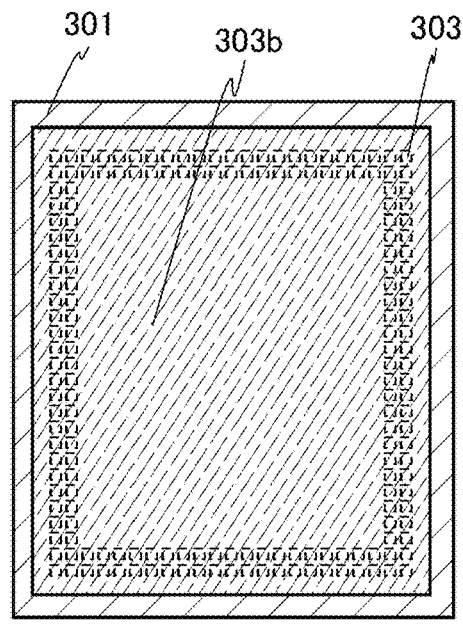

FIGS. 12D to 12F each illustrate an example of the top surface shape of a separation layer used in the method for manufacturing the light-emitting device of one embodiment of the present invention.

FIG. 12D illustrates an example of a separation layer used in the case where a photocurable resin is used for the first bonding layer 407 and the second bonding layer 404. In FIG.

12D, an island-shaped separation layer 303 is provided over a formation substrate 301. In that case, the thickness of the separation layer 303 is set so that light for curing the photocurable resin used for the bonding layers transmits the separation layer 303. Accordingly, the photocurable resin used for the first bonding layer 407 and the second bonding layer 404 can be cured and the reliability of the light-emitting device can be increased. The separation layer 303 preferably has a thickness of 2 nm or more because a decrease in the yield of the formation process or the peeling process of the separation layer 303 can be suppressed.

FIGS. 12E and 12F each illustrate an example of a separation layer used in the case where a photocurable resin is used for the second bonding layer 404.

In FIG. 12E, an island-shaped separation layer provided over the formation substrate 301 has a region 303a, which is thinner than a region 303b, in a frame shape. The region 303a is formed so as to overlap with the second bonding layer 404.

In FIG. 12F, an island-shaped separation layer provided over the formation substrate 301 has the grid-like region 303a, which is thinner than the region 303b, in a frame shape. The grid-like region 303a is formed so as to overlap with the second bonding layer 404.

The thickness of the region 303a illustrated in each of FIGS. 12E and 12F is set so that light for curing the photocurable resin used for the second bonding layer 404 transmits the region 303a. Accordingly, the photocurable resin used for the second bonding layer 404 can be cured and the reliability of the light-emitting device can be increased. The region 303a preferably has a thickness of 2 nm or more because a decrease in the yield of the formation process or the peeling process of the separation layer can be suppressed. Note that when the region 303b thicker than the region 303a is too thick, it takes long time to form or process the film; thus, the thickness of the region 303b is preferably greater than or equal to 2 nm and less than or equal to 1000 nm, further preferably greater than or equal to 5 nm and less than or equal to 100 nm.

An example of a manufacturing method of a separation layer including the thin region 303a and the thick region 303b will be described with reference to FIGS. 13A to 13D.

Figure 13A:
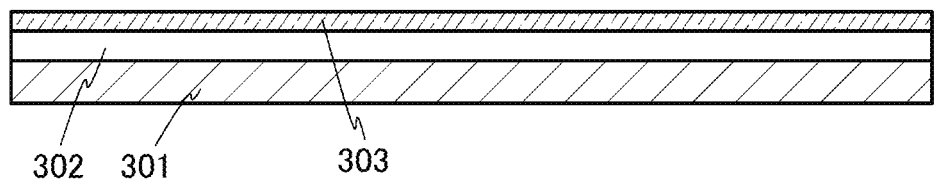
FIGS. 13A to 13D illustrate an example of a method for forming a separation layer.

First, as illustrated in FIG. 13A, a base film 302 is formed over the formation substrate 301 and the separation layer 303 is formed over the base film 302.

Here, a 25-nm-thick tungsten film is formed as the separation layer 303.

Figure 13B:
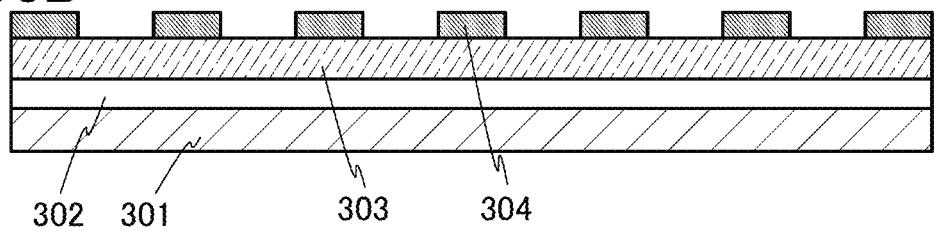
Figure 13C:
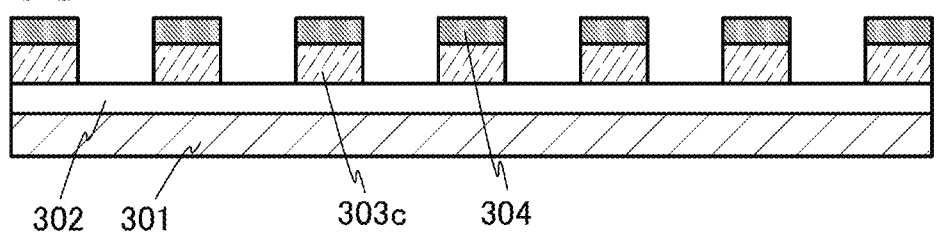
Figure 13D:
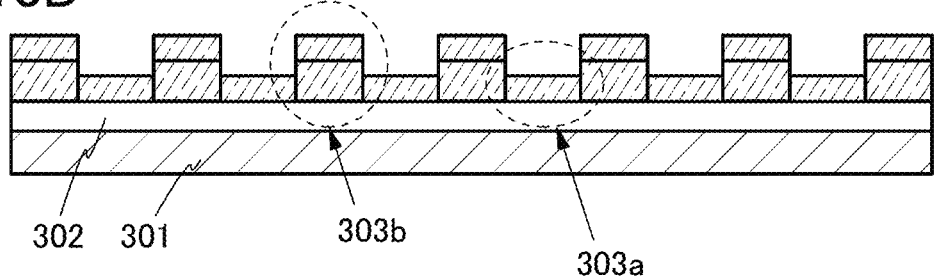

Next, resists 304 are formed over the separation layer 303 as illustrated in FIG. 13B.

Then, the separation layer 303 is processed into a plurality of island-shaped separation layers 303c by a photolithography process.

Subsequently, another separation layer is formed over the base film 302 and the separation layers 303c: here, a 5-nm-thick tungsten film is formed.

In the above manner, a separation layer including the region 303b having a thickness of approximately 30 nm and the region 303a having a thickness of approximately 5 nm can be formed. When the bonding layer which is to be cured is provided so as to overlap with the thin region 303a, the bonding layer can be surely cured in a short time.

The case where tungsten is used for the separation layer is described above; however, the present invention is not limited thereto. In the case where a material whose light-transmitting property changes depending on its thickness (e.g., a metal) is used for the separation layer, as in the case of using tungsten, at least part of a region overlapping with the bonding layer is thinned so that light for curing a photocurable resin can be transmitted through the region; as a result, the bonding layer can be cured more surely. When the bonding layer is cured through the separation layer, the bonding layer can be inside the light-emitting device; thus, the reliability of the light-emitting device can be increased.

<Curing Method 2 of Bonding Layer>

Next, an example where a thermosetting resin is used for the second bonding layer 404 will be described.

In the case where a thermosetting resin is used for the bonding layer, the bonding layer can be cured by heat treatment using a heat source such as a heater or a light source such as a lamp or a laser beam. In the case of using lamp light or a laser beam, the light needs to be transmitted through the formation substrate, the separation layer, and the peeled layer.

When the peeled layer includes a color filter or an organic EL element having low heat resistance and a thermosetting resin is used as a material of the bonding layer, the color filter or the organic EL element might be damaged by heat at the time of heat treatment.

To avoid this, in the method for manufacturing the light-emitting device of one embodiment of the present invention, an absorption layer is formed so as to overlap with the bonding layer. Then, the bonding layer is heated through the absorption layer to be cured. In this manner, the bonding layer that overlaps with the absorption layer can be selectively heated. In addition, a material having low heat resistance can be prevented from being heated.

The absorption layer absorbs irradiation light for heating the bonding layer and converts it into heat. The absorption layer is preferably formed using a material having a reflectance as low as 70% or lower with respect to irradiation light and having high absorbance. It is also preferable that the absorption layer be formed of a material having an excellent heat resistance property so that it does not change with heat. Furthermore, as a material that can be used for the absorption layer, for example, a metal nitride such as titanium nitride, tantalum nitride, molybdenum nitride, tungsten nitride, chromium nitride, and manganese nitride; molybdenum; titanium; tungsten; carbon; or the like is preferably used.

An absorption layer is not necessarily provided when the separation layer also serves as an absorption layer.

Figure 14A:
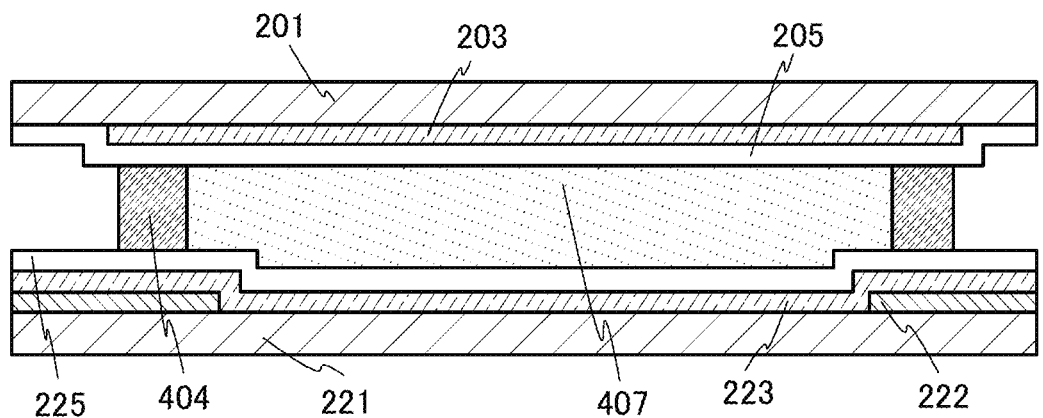
FIGS. 14A to 14C illustrate an example of a method for manufacturing a light-emitting device.

As illustrated FIG. 14A, for example, an island-shaped absorption layer 222 is formed over the formation substrate 221, the separation layer 223 that covers the absorption layer 222 is formed, and the peeled layer 225 is formed over the separation layer 223. Then, the peeled layer 205 that is provided over the formation substrate 201 with the separation layer 203 provided therebetween is attached to the peeled layer 225 by using the first bonding layer 407 and the second bonding layer 404.

Note that although FIG. 14A shows an example where the absorption layer 222 overlaps with the whole second bonding layer 404, the absorption layer 222 only needs to overlap with part of the second bonding layer 404.

When the absorption layer 222 is irradiated with lamp light or a laser beam from the formation substrate 221 side, the light is converted into heat by the absorption layer 222. As a result, the second bonding layer 404 can be cured by the heat.

In the method for manufacturing the light-emitting device of one embodiment of the present invention, the absorption layer is formed so as to overlap with the bonding layer, and a reflective layer is formed so as to overlap with the organic EL element and the like having low heat resistance. Then, the bonding layer is heated and cured through the absorption layer. In this manner, the bonding layer that overlaps with the absorption layer can be selectively heated. In addition, with the reflective layer, the organic EL element and the like can be prevented from being heated.

The reflective layer reflects and blocks light for heating the bonding layer so that the organic EL element and the like are not heated. The reflective layer is preferably formed using a material having high reflectance with respect to the irradiation light. Specifically, the reflective layer is preferably formed using a material having a reflectance as high as 85% or more, more preferably, a reflectance as high as 90% or more with respect to irradiation light.

As a material that can be used for the reflective layer, for example, aluminum, silver, gold, platinum, copper, an alloy containing aluminum (for example, an aluminum-titanium alloy and an aluminum-neodymium alloy), an alloy containing silver (a silver-neodymium alloy) or the like can be used.

Figure 14B:
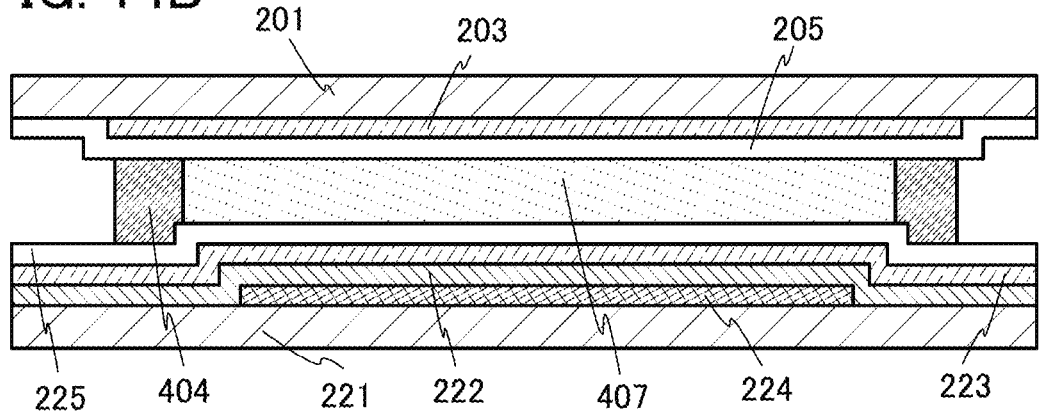

As illustrated in FIG. 14B, for example, a reflective layer 224 that overlaps with the organic EL element and the color filter is formed over the formation substrate 221, the absorption layer 222 is provided over the formation substrate 221 and the reflective layer 224, and the separation layer 223 and the peeled layer 225 are stacked in this order over the absorption layer 222. Then, the peeled layer 205 that is provided over the formation substrate 201 with the separation layer 203 provided therebetween are attached to the peeled layer 225 by using the first bonding layer 407 and the second bonding layer 404.

Note that although FIG. 14B shows an example where the reflective layer 224 and the second bonding layer 404 do not overlap with each other, the reflective layer 224 and the second bonding layer 404 may overlap with each other.

When the absorption layer 222 is irradiated with lamp light or a laser beam from the formation substrate 221 side, the light is converted into heat by the absorption layer 222. As a result, the second bonding layer 404 can be cured by the heat.

In the case of providing a heat-insulating layer that overlaps with the organic EL element and the color filter, a heat source such as a heater can also be used. For the heat-insulating layer, for example, titanium oxide, silicon oxide, silicon oxynitride, zirconium oxide, titanium carbide, or the like can be preferably used. Note that for the heat-insulating layer, a material having lower heat conductivity than materials used for the reflective layer and the absorption layer is used.

For the heat treatment, a discharge lamp typified by a flash lamp (e.g., a xenon flash lamp and a krypton flash lamp), a xenon lamp, or a metal halide lamp; or an exothermic lamp typified by a halogen lamp or a tungsten lamp can be used.

Examples of the laser used for the heat treatment include a gas laser such as an Ar laser, a Kr laser, or an excimer laser; a laser whose medium is single-crystal YAG, $YVO_4$, forsterite ($Mg_2SiO_4$), $YAlO_3$, or $GdVO_4$ to which one or more of Nd, Yb, Cr, Ti, Ho, Er, Tm, and Ta is added as a dopant, or a polycrystalline (ceramic) YAG, $Y_2O_3$, $YVO_4$, $YAlO_3$, or $GdVO_4$ to which one or more of Nd, Yb, Cr, Ti, Ho, Er, Tm, and Ta is added as a dopant; a glass laser; a ruby laser; an alexandrite laser; a Ti:sapphire laser; a copper vapor laser; and a gold vapor laser.

Figure 14C:
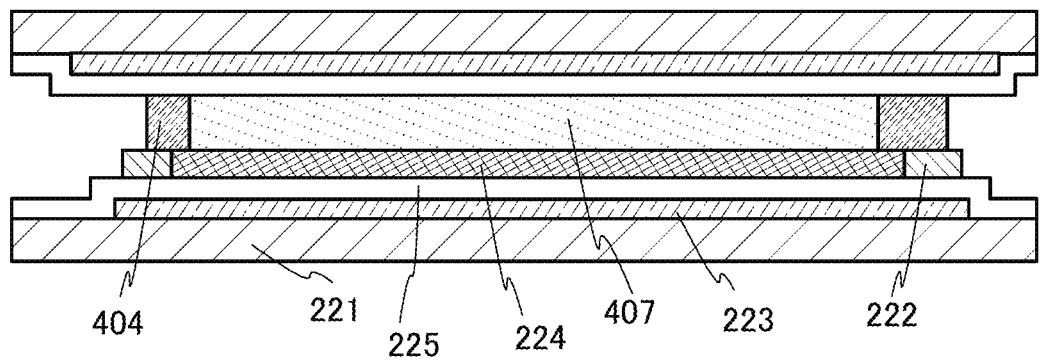

In the case where the light-emitting device can include the absorption layer 222 or the reflective layer 224, the absorption layer 222 or the reflective layer 224 may be formed over the separation layer 223 as illustrated in FIG. 14C. In that case, there is no limitation on the formation order of the layers composing the peeled layer 225, the absorption layer, and the reflective layer.

As described above, in the case where the bonding layer is formed using a thermosetting resin, the bonding layer can be selectively heated with the use of an absorption layer. Furthermore, with a reflective layer, the organic EL element having low heat resistance can be prevented from being damaged by heat. As a result, the bonding layer can be cured more surely. In addition, a decrease in the reliability of the light-emitting device can be suppressed.

Owing to the curing method of the bonding layer described in this embodiment, a thermosetting resin or a photocurable resin can be used for the bonding layer. Furthermore, the bonding layer can be cured surely in a short time. In addition, the organic EL element or the color filter can be prevented from being damaged by heat even when heat treatment is performed. Moreover, a decrease in the yield of the peeling process can be suppressed even when the separation layer is thinned so that light can be transmitted through the separation layer.

This embodiment can be implemented in appropriate combination with any of the other embodiments.

Embodiment 3

In this embodiment, electronic devices and lighting devices including the light-emitting device of one embodiment of the present invention will be described with reference to FIGS. 15A to 15G.

Owing to the light-emitting device of one embodiment of the present invention, highly reliable flexible electronic devices and highly reliable flexible lighting devices can be manufactured.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The light-emitting device of one embodiment of the present invention has flexibility and therefore can be incorporated along a curved inside/outside wall surface of a house or a building or a curved interior/exterior surface of a car.

Figure 15A:
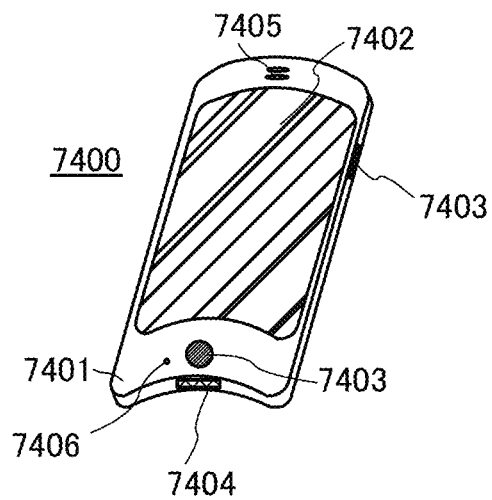
FIGS. 15A to 15G illustrate examples of electronic devices and lighting devices.

FIG. 15A illustrates an example of a cellular phone. A cellular phone 7400 includes a display portion 7402 incorporated in a housing 7401, operation buttons 7403, an external connection port 7404, a speaker 7405, a microphone 7406, and the like. Note that the cellular phone 7400 is manufactured using the light-emitting device of one embodiment of the present invention for the display portion 7402. According to one embodiment of the present invention, a highly reliable cellular phone having a curved display portion can be provided.

When the display portion 7402 of the cellular phone 7400 illustrated in FIG. 15A is touched with a finger or the like, data can be input into the cellular phone 7400. Moreover, operations such as making a call and inputting a letter can be performed by touch on the display portion 7402 with a finger or the like.

With the operation buttons 7403, power on or off can be switched. In addition, a variety of images displayed on the display portion 7402 can be switched; switching a mail creation screen to a main menu screen, for example.

Figure 15B:
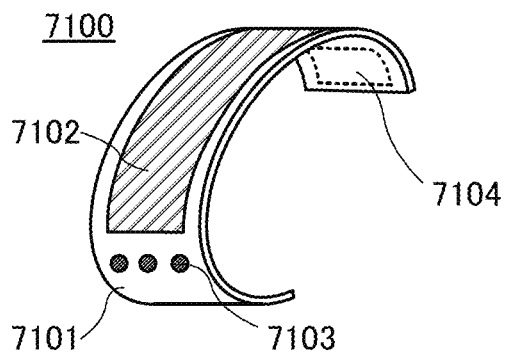

FIG. 15B is an example of a wristband-type portable display device. A portable display device 7100 includes a housing 7101, a display portion 7102, operation buttons 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation buttons 7103, power on/off, switching of displayed videos, adjusting volume, and the like can be performed.

Here, the display portion 7102 includes the light-emitting device of one embodiment of the present invention. According to one embodiment of the present invention, a highly reliable portable display device having a curved display portion can be provided.

Figure 15C:
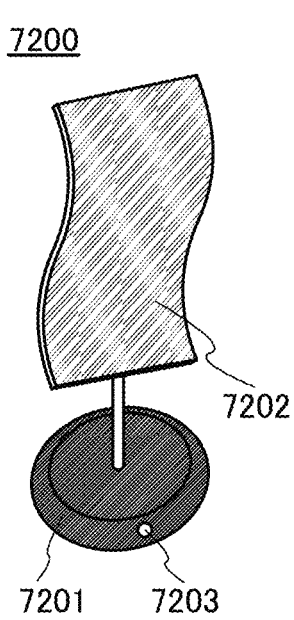
Figure 15D:
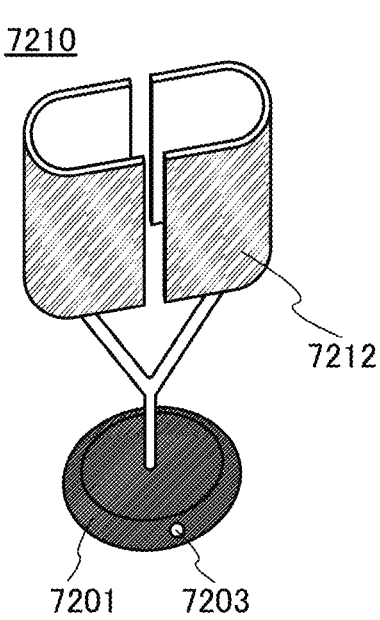
Figure 15E:
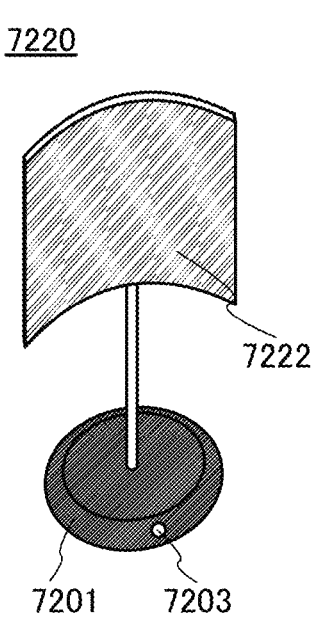

FIGS. 15C to 15E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 15C includes a light-emitting portion 7202 having a wave-shaped light-emitting surface, which is good-design lighting device.

FIG. 21A illustrates an example of a light-emitting device that can be used in the light-emitting portion 7202 illustrated in FIG. 15C. A light-emitting device 7209 illustrated in FIG. 21A includes a light-emitting panel 7205 that can emit light while being curved. The light-emitting panel 7205 has flexibility and includes a light-emitting region 7204 having a curved projection and a curved depression. Note that the light-emitting region 7204 is positioned on a right side of the light-emitting device 7209.

FIGS. 21B and 21C each illustrate an example of a plan view of a back side of the light-emitting device 7209. FIG. 21B also illustrates a cross-sectional view taken along dashed-dotted line Z1-Z2 in the plan view. FIG. 21C also illustrates a cross-sectional view taken along dashed-dotted line Z3-Z4 in the plan view. Note that FIGS. 21B and 21C each illustrate an example where the light-emitting device 7209 is not curved.

As illustrated in FIG. 21B, the light-emitting device may have a structure in which an FPC 7207 electrically connected to the light-emitting panel 7205 and a support 7206 are provided on the back side.

Alternatively, as illustrated in FIG. 21C, the light-emitting device may have a structure in which the FPC 7207 electrically connected to the light-emitting panel 7205 and the support 7206 that covers the FPC 7207 are provided on the back side.

Further alternatively, the FPC and the light-emitting panel may be provided on both sides of the support 7206 as illustrated in FIG. 21D, so that a double-sided light-emitting device can be manufactured.

As the support 7206, the flexible substrate described as an example in Embodiment 1 or a curved non-flexible substrate can be used. The light-emitting panel 7205 is curved along the support 7206; as a result, the light-emitting portion 7202 can have a waved light-emitting surface.

Figure 22A:
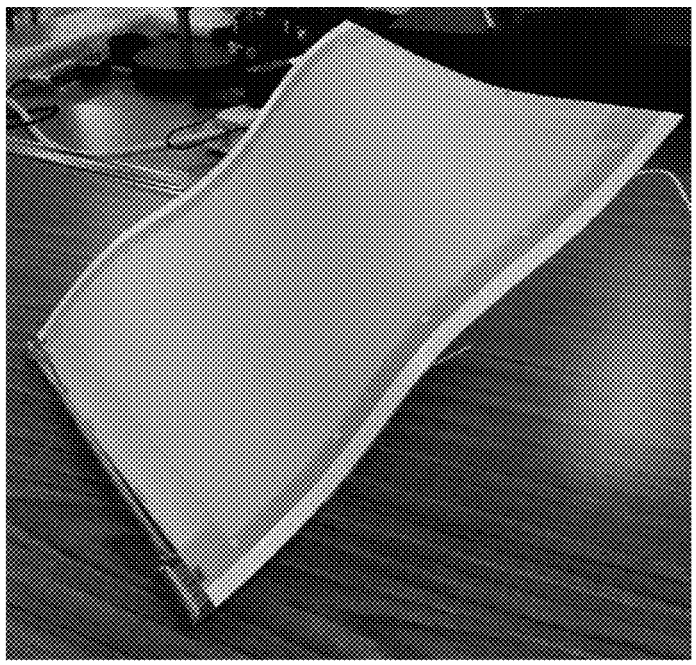
FIGS. 22A to 22C are photographs of an example of a light-emitting device that can be used in a light-emitting portion.
Figure 22B:
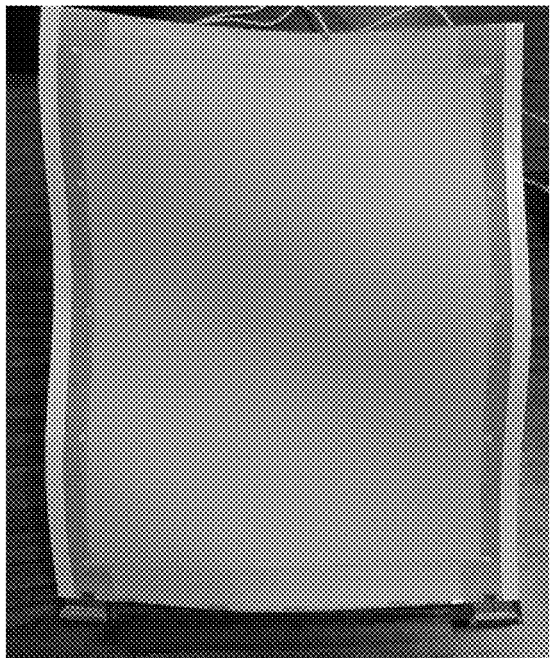
Figure 22C:
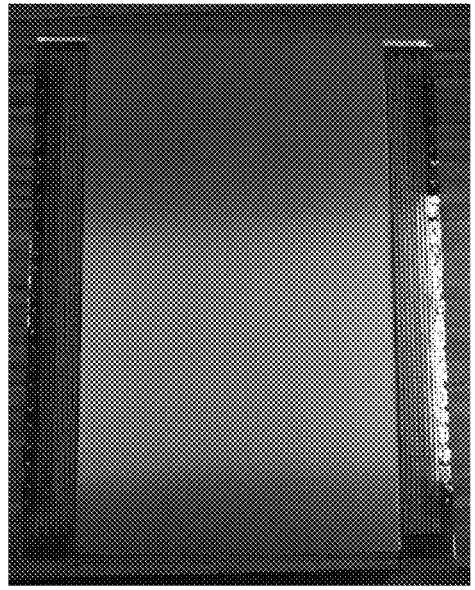

FIGS. 22A and 22B show a perspective view and a plan view of an example of the light-emitting device 7209, respectively. FIG. 22C shows a positional relationship between the FPC 7207 and the support 7206 in the structure illustrated in FIG. 21B.

A light-emitting portion 7212 included in the lighting device 7210 illustrated in FIG. 15D has two convex-curved light-emitting portions symmetrically placed. Thus, all directions can be illuminated with the lighting device 7210 as a center.

The lighting device 7220 illustrated in FIG. 15E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes the light-emitting device of one embodiment of the present invention. According to one embodiment of the present invention, a highly reliable lighting device having a curved light-emitting portion can be provided.

Figure 15F:
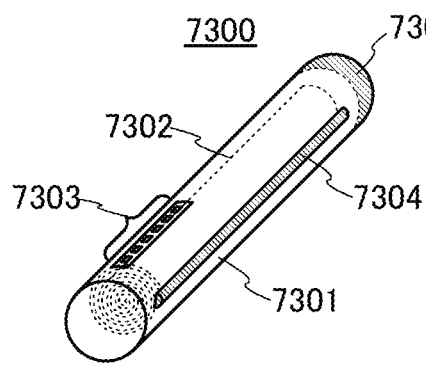

FIG. 15F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power on/off, switching of displayed videos, and the like can be performed.

Figure 15G:
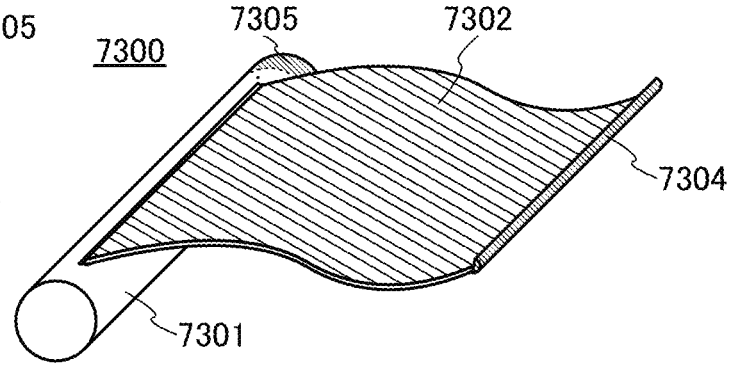

FIG. 15G illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation button 7303 is provided not in the center of the housing 7301 but on one side of the housing 7301 as illustrated in FIG. 15F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the display device of one embodiment of the present invention. According to one embodiment of the present invention, a lightweight and highly reliable display device can be provided.

This embodiment can be freely combined with any of the other embodiments.

Example

In this example, the flexible light-emitting device of one embodiment of the present invention was fabricated and its reliability was evaluated.

Figure 18A:
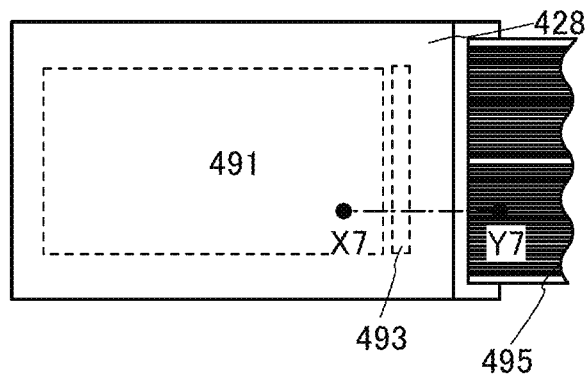
FIGS. 18A and 18B illustrate a light-emitting device, which is a comparative sample in Example.
Figure 18B:
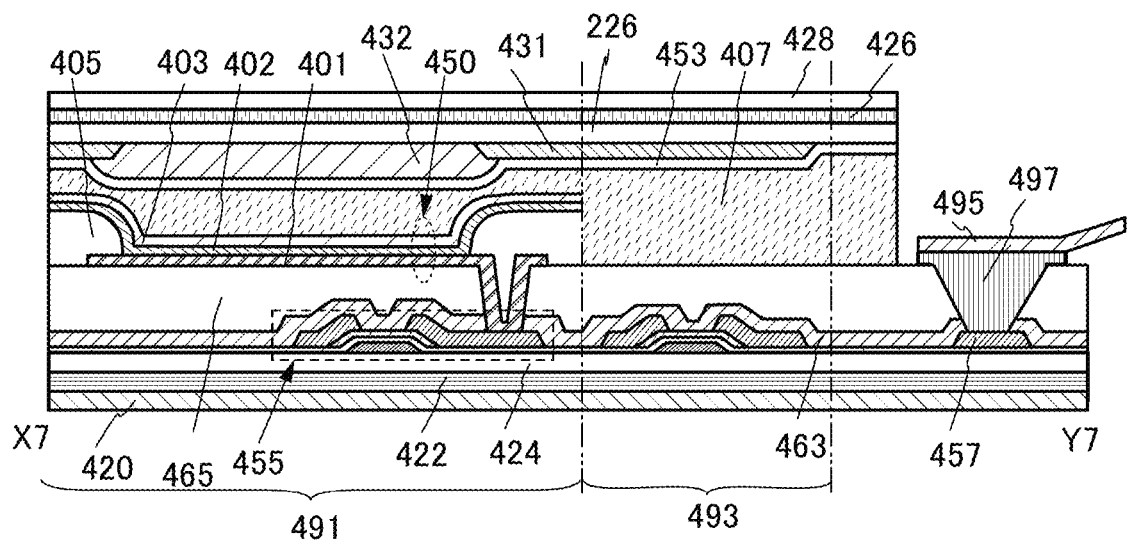

FIG. 17A1 is a plan view of Sample 1 fabricated in this example, and FIG. 17B is a cross-sectional view taken along dashed-dotted line X5-Y5 in FIG. 17A1. FIG. 17A2 is a plan view of Sample 2 fabricated in this example, and FIG. 17C is a cross-sectional view taken along dashed-dotted line X6-Y6 in FIG. 17A2. FIG. 18A is a plan view of a comparative sample fabricated as a comparative example, and FIG. 18B is a cross-sectional view taken along dashed-dotted line X7-Y7 in FIG. 18A.

Note that descriptions on components of the sample in this example that are similar to those of Structural Example 1 (FIGS. 2A and 2B) described in Embodiment 1 are omitted in some cases. Furthermore, descriptions on manufacturing steps in a method for fabricating the sample in this example that are similar to those in Method 1 for Manufacturing Device (FIGS. 6A to 6D, FIGS. 7A to 7D, and FIGS. 8A to 8D) described in Embodiment 1 are omitted in some cases.

Sample 1 includes the flexible substrate 420, the flexible substrate 428, the transistor 455 between the flexible substrate 420 and the flexible substrate 428, the organic EL element 450 between the transistor 455 and the flexible substrate 428, the first bonding layer 407 between the flexible substrate 428 and the organic EL element 450, and a second bonding layer 404a in a frame shape surrounding the first bonding layer 407.

In Sample 1, an organic EL element and a transistor included in the light-emitting portion 491 and the driver circuit portion 493 are sealed by the flexible substrate 420, the flexible substrate 428, the first bonding layer 407, and the second bonding layer 404a.

Sample 1 is different from Structural Example 1 (FIGS. 2A and 2B) in that the first bonding layer 407 is provided between the insulating layer 226 and the second bonding layer 404a.

Sample 2 includes the flexible substrate 420, the flexible substrate 428, the transistor 455 between the flexible substrate 420 and the flexible substrate 428, the organic EL element 450 between the transistor 455 and the flexible substrate 428, the first bonding layer 407 between the flexible substrate 428 and the organic EL element 450, a third bonding layer 404b in a frame shape surrounding the first bonding layer 407, and the second bonding layer 404a in a frame shape surrounding the third bonding layer 404b.

In Sample 2, an organic EL element and a transistor included in the light-emitting portion 491 and the driver circuit portion 493 are sealed by the flexible substrate 420, the flexible substrate 428, the first bonding layer 407, the third bonding layer 404b, and the second bonding layer 404a.

In the light-emitting device of one embodiment of the present invention, at least one of the second bonding layer 404a and the third bonding layer 404b that surround the first bonding layer 407 preferably has a higher gas barrier property than the first bonding layer 407. It is further preferable that both the second bonding layer 404a and the third bonding layer 404b have a higher gas barrier property than the first bonding layer 407.

Sample 2 is different from Structural Example 1 (FIGS. 2A and 2B) in that the third bonding layer 404b is included and the first bonding layer 407 is provided between the insulating layer 226 and the second bonding layer 404a and between the insulating layer 226 and the third bonding layer 404b.

A comparative sample includes the flexible substrate 420, the flexible substrate 428, the transistor 455 between the flexible substrate 420 and the flexible substrate 428, the organic EL element 450 between the transistor 455 and the flexible substrate 428, and the first bonding layer 407 between the flexible substrate 428 and the organic EL element 450.

In the comparative sample, an organic EL element and a transistor included in the light-emitting portion 491 and the driver circuit portion 493 are sealed by the flexible substrate 420, the flexible substrate 428, and the first bonding layer 407.

The comparative sample is different from Structural Example 1 (FIGS. 2A and 2B) in that the second bonding layer 404 is not included.

In each method for fabricating Samples 1 and 2 and the comparative sample, first, a separation layer was formed over each of a pair of formation substrates, and then a peeled layer was formed over each separation layer. A 30-nm-thick tungsten film was formed as each of the separation layers. As the peeled layer over one of the formation substrates, a stack including layers from the insulating layer 424 to the organic EL element 450 in FIG. 17B was formed. As the peeled layer over the other of the formation substrates, a stack including layers from the insulating layer 226 to the overcoat 453 in FIG. 17B was formed.

Next, in Sample 1, the pair of formation substrates were attached to each other by using the first bonding layer 407 and the second bonding layer 404a so that the surfaces over which the peeled layers were formed face each other, and then, the first bonding layer 407 and the second bonding layer 404a were cured.

In Sample 2, the pair of formation substrates were attached to each other by using the first bonding layer 407, the second bonding layer 404a, and the third bonding layer 404b so that the surfaces over which the peeled layers were formed face each other, and then, the first bonding layer 407, the second bonding layer 404a, and the third bonding layer 404b were cured.

In the comparative sample, the pair of formation substrates were attached to each other by using the first bonding layer 407 so that the surfaces over which the peeled layers were formed face each other, and then, the first bonding layer 407 was cured.

In each of the samples, a thermosetting resin was used for the first bonding layer 407. The first bonding layer 407 was cured by heat treatment at 80° C. for two hours.

In Sample 1, an ultraviolet photocurable resin was used for the second bonding layer 404a. The second bonding layer 404a was cured by ultraviolet light irradiation for 200 seconds.

In Sample 2, an ultraviolet photocurable resin was used for the second bonding layer 404a and an ultraviolet photocurable resin containing zeolite was used for the third bonding layer 404b. Zeolite can function as a dry agent. The second bonding layer 404a and the third bonding layer 404b were cured by ultraviolet light irradiation for 200 seconds. Note that in the case where a bonding layer formed using a resin containing a dry agent has a small amount of water vapor permeation because moisture and the like are adsorbed by the dry agent, the bonding layer can be regarded as a layer having a high gas barrier property even when the gas barrier property of the resin is low.

As shown by the results of the transmittance described in Curing Method 1 of Bonding Layer in Embodiment 2, the ultraviolet photocurable resins in Samples 1 and 2 were able to be cured through the 30-nm-thick tungsten film.

Note that in the methods for fabricating the samples, bonding was performed in a reduced-pressure atmosphere.

Next, a starting point of peeling was formed by laser irradiation. In Samples 1 and 2, in particular, the laser irradiation was performed on a region overlapping with the cured second bonding layer 404a. Thus, Sample 1 can be a light-emitting device including the second bonding layer 404a and the first bonding layer 407, and Sample 2 can be a light-emitting device including the second bonding layer 404a, the third bonding layer 404b, and the first bonding layer 407.

Then, one formation substrate and the peeled layer thereon were separated from the formed starting point of peeling.

After that, the exposed peeled layer was attached to a flexible substrate by using an adhesive layer and then, the adhesive layer was cured. Next, a starting point of peeling was formed with a cutter knife, and the other formation substrate and the peeled layer thereon were separated from the formed starting point of peeling.

Subsequently, the exposed peeled layer was attached to a flexible substrate by using an adhesive layer and then, the adhesive layer was cured. Then, the conductive layer 457 was exposed and electrically connected to the FPC 495.

A reliability test was performed on the fabricated samples. Specifically, the samples were preserved under a high-temperature and high-humidity environment (temperature: 65° C., humidity: 90%). FIGS. 19A to 19G show the observation results of display conditions of the samples obtained using an optical microscope. In each of FIGS. 19A to 19F, the upper part is a photograph at 100-fold magnification, and the lower part is a photograph at 500-fold magnification. FIG. 19G only shows a photograph at 100-fold magnification.

FIG. 19A shows the display condition of the comparative sample before the reliability test. FIG. 19B shows the display condition of the comparative sample after preservation under a high-temperature and high-humidity environment for 100 hours.

FIG. 19C shows the display condition of Sample 1 before the reliability test. FIG. 19D shows the display condition of Sample 1 after preservation under a high-temperature and high-humidity environment for 500 hours.

FIG. 19E shows the display condition of Sample 2 before the reliability test. FIG. 19F shows the display condition of Sample 2 after preservation under a high-temperature and high-humidity environment for 500 hours. FIG. 19G shows the display condition of Sample 2 after preservation under a high-temperature and high-humidity environment for 1000 hours.

In the comparative sample, generation of shrinkage (here, luminance degradation from an end portion of the light-emitting portion, or an increase in a non-light-emitting region in the light-emitting portion) was observed after the reliability test for 100 hours. After the reliability test for 500 hours, shrinkage was slightly observed in Sample 1, but not in Sample 2. Moreover, even after the reliability test for 1000 hours, shrinkage was not observed in Sample 2 even at the four corners of the light-emitting portion, where shrinkage is said to be easily generated.

The results in this example show that Samples 1 and 2 each including one embodiment of the present invention have higher reliability than the comparative sample. It is suggested that when a bonding layer in a frame shape surrounds a first bonding layer as in Samples 1 and 2, moisture can be prevented from entering the first bonding layer and an element such as an organic EL element.

In addition, a resin containing a dry agent is used for a third bonding layer in a frame shape surrounding the first bonding layer, and a resin not containing a dry agent is used for a second bonding layer in a frame shape surrounding the third bonding layer as in Sample 2; thus, the reliability of the light-emitting device can be further increased. The second bonding layer having a high gas barrier property can prevent the entry of moisture and the like; even when moisture passes through the second bonding layer, the moisture can be adsorbed by the dry agent contained in the third bonding layer. This suggests that moisture can be prevented from entering the first bonding layer and an element such as the organic EL element.

This application is based on Japanese Patent Application serial no. 2013-184698 filed with Japan Patent Office on Sep. 6, 2013 and Japanese Patent Application serial no. 2013-218601 filed with Japan Patent Office on Oct. 21, 2013, the entire contents of which are hereby incorporated by reference.

What is claimed is:

1. A light-emitting device comprising:
a first flexible substrate;
a light-emitting element over the first flexible substrate;
a first bonding layer over the light-emitting element;
two second bonding layers arranged so as to be in contact with the first bonding layer; and
a second flexible substrate over the first bonding layer and the two second bonding layers,
wherein an oxygen permeability of the two second bonding layers is lower than an oxygen permeability of the first bonding layer, and
wherein the two second bonding layers are spaced apart from each other.

2. A light-emitting device comprising:
a first flexible substrate;
a light-emitting element over the first flexible substrate;
a first bonding layer over the light-emitting element;
two second bonding layers arranged so as to be in contact with the first bonding layer; and
a second flexible substrate over the first bonding layer and the two second bonding layers,
wherein a water vapor permeability of the two second bonding layers is lower than a water vapor permeability of the first bonding layer, and
wherein the two second bonding layers are spaced apart from each other.

* * * * *